US012501774B2

(12) United States Patent
Choi et al.

(10) Patent No.: US 12,501,774 B2
(45) Date of Patent: Dec. 16, 2025

(54) DISPLAY APPARATUS

(71) Applicant: SAMSUNG DISPLAY CO., LTD., Yongin-si (KR)

(72) Inventors: Jonghyun Choi, Yongin-si (KR); Younjoon Kim, Yongin-si (KR); Kijune Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 314 days.

(21) Appl. No.: 18/137,713

(22) Filed: Apr. 21, 2023

(65) Prior Publication Data

US 2024/0090260 A1    Mar. 14, 2024

(30) Foreign Application Priority Data

Sep. 13, 2022   (KR) .................. 10-2022-0115106

(51) Int. Cl.
*H10K 59/121*    (2023.01)
*G09G 3/3233*    (2016.01)
*H10K 59/131*    (2023.01)

(52) U.S. Cl.
CPC ....... *H10K 59/1213* (2023.02); *G09G 3/3233* (2013.01); *H10K 59/131* (2023.02); *G09G 2300/0408* (2013.01); *G09G 2300/0426* (2013.01); *G09G 2300/0819* (2013.01);
(Continued)

(58) Field of Classification Search
CPC ......... G09G 3/3233; G09G 2300/0408; G09G 2300/0426; G09G 2300/0819; G09G 2300/0842; G09G 2300/0861; H10K 59/1213; H10K 59/131
See application file for complete search history.

(56) References Cited

U.S. PATENT DOCUMENTS 9,825,176 B2    11/2017    Lee et al.
10,984,721 B2    4/2021    Yang et al.
(Continued)

FOREIGN PATENT DOCUMENTS

KR    1020050052033 A    6/2005
KR    1020140136783 A    12/2014
(Continued)

OTHER PUBLICATIONS

Machine translation of KR 20220100620 (Year: 2025).*

*Primary Examiner* — Michael Pervan
(74) *Attorney, Agent, or Firm* — CANTOR COLBURN LLP

(57) ABSTRACT

A display apparatus includes a substrate including a display area on which a display element is disposed, an emission control transistor which is disposed in the display area, includes a first semiconductor layer, and is connected to a pixel electrode of an organic light-emitting diode, a switching transistor disposed in the display area and including a second semiconductor layer, and a first initialization transistor disposed in the display area and including a third semiconductor layer, wherein the first semiconductor layer and the second semiconductor layer each include a silicon semiconductor, the third semiconductor layer includes an oxide semiconductor, and at least one of the emission control transistor, the switching transistor, and the first initialization transistor includes a dual gate electrode.

20 Claims, 13 Drawing Sheets

(52) U.S. Cl.
CPC ............... *G09G 2300/0842* (2013.01); *G09G 2300/0861* (2013.01)

(56) References Cited

U.S. PATENT DOCUMENTS

2007/0120118 A1* 5/2007 Kubota ............. G02F 1/134336
257/40
2019/0278145 A1 9/2019 Tanaka et al.

FOREIGN PATENT DOCUMENTS

| | | | |
|---|---|---|---|
| KR | 1020190067956 A | | 6/2019 |
| KR | 20220100620 A | * | 7/2022 |

* cited by examiner

DISPLAY APPARATUS

This application claims priority to Korean Patent Application No. 10-2022-0115106, filed on Sep. 13, 2022, and all the benefits accruing therefrom under 35 U.S.C. § 119, the content of which in its entirety is herein incorporated by reference.

BACKGROUND

1. Field

Embodiments relate to display apparatuses.

2. Description of the Related Art

Display apparatuses visually display data. Display apparatuses may be used as displays of small-sized products, such as mobile phones, and large-sized products, such as televisions.

A display apparatus includes a plurality of pixels that receive electrical signals and emit light to display an image to the outside. Each of the pixels includes a display element. In an embodiment, an organic light-emitting display includes an organic light-emitting diode ("OLED") as a display element. In general, in the organic light-emitting display, a thin-film transistor and the OLED are formed on a substrate, and the OLED emits light by itself.

In general, the display apparatus includes a display element and a driving circuit for controlling an electrical signal to be applied to the display element. The driving circuit includes a thin-film transistor ("TFT"), a storage capacitor, and a plurality of lines.

Recently, various attempts for minimizing damage to circuits in display apparatuses due to an external shock are being made.

SUMMARY

In a display apparatus according to the related art, there is a substantially high probability that a defect will occur due to an external shock, and it is not easy to display a high-quality image.

Embodiments include a display apparatus on which a high-resolution image may be displayed with a substantially low defect rate even in the case of an external shock. However, the embodiments are only examples, and the scope of the disclosure is not limited thereto.

Additional features will be set forth in part in the description that follows and, in part, will be apparent from the description, or may be learned by practice of the embodiments of the disclosure.

In an embodiment of the disclosure, a display apparatus includes a substrate including a display area on which a display element is disposed, an emission control transistor which is disposed in the display area, includes a first semiconductor layer, and is connected to a pixel electrode of an organic light-emitting diode, a switching transistor disposed in the display area and including a second semiconductor layer, and a first initialization transistor disposed in the display area and including a third semiconductor layer, wherein the first semiconductor layer and the second semiconductor layer each include a silicon semiconductor, the third semiconductor layer includes an oxide semiconductor, and at least one of the emission control transistor, the switching transistor, and the first initialization transistor includes a dual gate electrode.

In an embodiment, the display apparatus may further include an emission control line partially overlapping the first semiconductor layer, wherein the emission control line includes an opening, and the dual gate electrode of the emission control transistor is provided in a first emission control gate electrode and a second emission control gate electrode which are both obtained by branching by the opening.

In an embodiment, the opening may be provided as a through hole in a closed shape.

In an embodiment, the display apparatus may further include a first signal line partially overlapping the second semiconductor layer, wherein the second semiconductor layer includes an opening in a closed shape, and the first signal line includes a first switching gate electrode and a second switching gate electrode respectively overlapping a $2^{nd}$-$1^{st}$ semiconductor layer and a $2^{nd}$-$2^{nd}$ semiconductor layer that are separated by the opening.

In an embodiment, the display apparatus may further include a second signal line partially overlapping the third semiconductor layer, wherein the second signal line includes a first initialization gate electrode and a second initialization gate electrode respectively overlapping a $3^{rd}$-$1^{st}$ semiconductor layer and a $3^{rd}$-$2^{nd}$ semiconductor layer.

In an embodiment, the second signal line may include a $2^{nd}$-$1^{st}$ signal line disposed under the third semiconductor layer and a $2^{nd}$-$2^{nd}$ signal line disposed over the third semiconductor layer, the $2^{nd}$-$1^{st}$ signal line may include a lower gate electrode in an area overlapping the third semiconductor layer, and the $2^{nd}$-$2^{nd}$ signal line may include an upper gate electrode in an area overlapping the third semiconductor layer.

In an embodiment, at least one of the lower gate electrode and the upper gate electrode may be provided as a dual gate electrode.

In an embodiment, the first semiconductor layer and the second semiconductor layer may be integrally provided as a single body.

In an embodiment, the display apparatus may further include a driving transistor which controls a magnitude of a driving current flowing to the display element, wherein the switching transistor transfer a data voltage to a source electrode of the driving transistor, the emission control transistor generate a path of the driving current between the display element, and the first initialization transistor apply an initialization voltage to a gate electrode of the driving transistor.

In an embodiment, the display apparatus may further include a first power voltage line, a first planarization layer covering the first power voltage line, and a second planarization layer on the first planarization layer, wherein the pixel electrode connected to the emission control transistor is disposed on the second planarization layer.

In an embodiment of the disclosure, a display apparatus includes a substrate including a display area on which a display element is disposed, a driving transistor which controls a magnitude of a driving current flowing to the display element, an emission control transistor disposed in the display area and connected to a pixel electrode of an organic light-emitting diode, a switching transistor which is disposed in the display area, includes a second semiconductor layer including a silicon semiconductor, and transfer a data voltage to a source electrode of the driving transistor, a first initialization transistor which is disposed in the display area, includes a third semiconductor layer including an oxide semiconductor, and apply an initialization voltage to a gate electrode of the driving transistor, an emission control line partially overlapping the first semiconductor layer, and a first signal line partially overlapping the second semiconductor layer, wherein the emission control transistor and the switching transistor each include a dual gate electrode.

In an embodiment, an opening may be defined in each of the emission control line and the second semiconductor layer.

In an embodiment, the dual gate electrode of the emission control transistor may be provided in a first emission control gate electrode and a second emission control gate electrode which are both obtained by branching by the opening of the emission control line.

In an embodiment, the first signal line may include a first switching gate electrode and a second switching gate electrode respectively overlapping a $2^{nd}$-$1^{st}$ semiconductor layer and a $2^{nd}$-$2^{nd}$ semiconductor layer that are separated by the opening of the second semiconductor layer.

In an embodiment, the display apparatus may further include a second signal line overlapping the third semiconductor layer in a plurality of areas, wherein the second signal line includes a first initialization gate electrode and a second initialization gate electrode respectively overlapping a $3^{rd}$-$1^{st}$ semiconductor layer and a $3^{rd}$-$2^{nd}$ semiconductor layer.

In an embodiment, the display apparatus may further include an upper gate electrode and a lower gate electrode respectively disposed over and under the third semiconductor layer, wherein at least one of the upper gate electrode and the lower gate electrode is provided as a dual gate electrode.

In an embodiment, the first semiconductor layer and the second semiconductor layer may be integrally provided as a single body, the switching transistor and the emission control transistor may be provided in p-channel metal-oxide semiconductor field-effect transistors, and the first initialization transistor may be provided in an n-channel metal-oxide semiconductor field-effect transistor.

In an embodiment, the display apparatus may further include a first power voltage line, a first planarization layer covering the first power voltage line, and a data line disposed on the first planarization layer and at least partially overlapping the first power voltage line.

In an embodiment, the display apparatus may further include a second power voltage line disposed on the first planarization layer and electrically connected to the first power voltage line.

In an embodiment, the display apparatus may further include a second planarization layer on the first planarization layer, wherein the pixel electrode connected to the emission control transistor is disposed on the second planarization layer.

BRIEF DESCRIPTION OF THE DRAWINGS

The above and other features and advantages of illustrative embodiments of the disclosure will be more apparent from the following description taken in conjunction with the accompanying drawings, in which.

DETAILED DESCRIPTION

Figure 1:
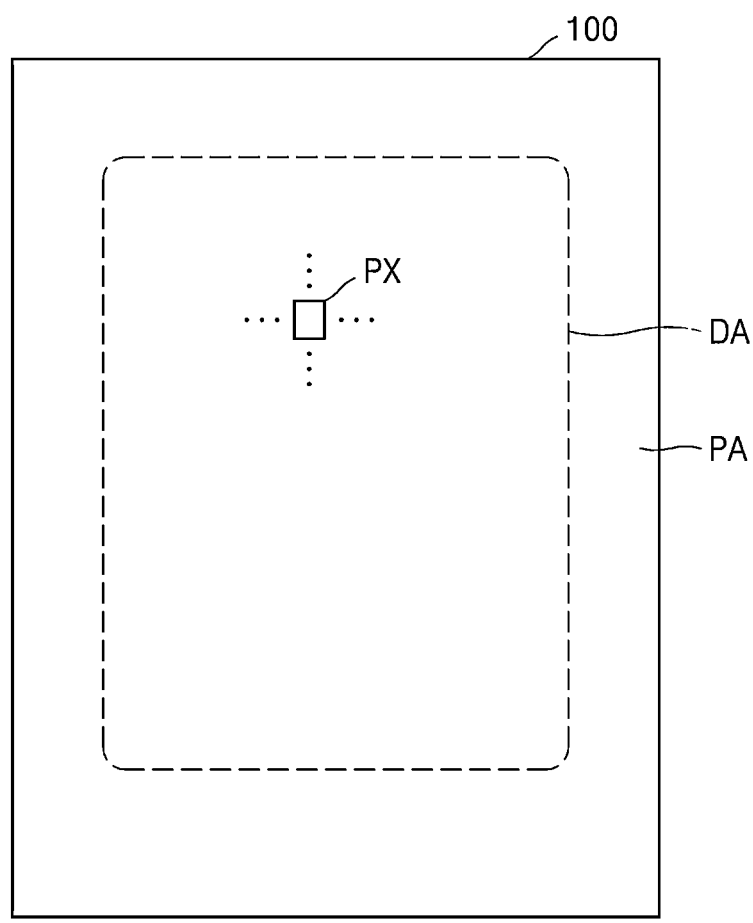
FIG. 1 is a diagram schematically illustrating an embodiment of a display apparatus.

Reference will now be made in detail to embodiments, of which are illustrated in the accompanying drawings, wherein like reference numerals refer to like elements throughout. In this regard, the illustrated embodiments may have different forms and should not be construed as being limited to the descriptions set forth herein. Accordingly, the embodiments are merely described below, by referring to the drawing figures, to explain features of the description. As used herein, the term "and/or" includes any and all combinations of one or more of the associated listed items. Throughout the disclosure, the expression "at least one of a, b, or c" indicates only a, only b, only c, both a and b, both a and c, both b and c, all of a, b, and c, or any variations thereof.

As the disclosure allows for various changes and numerous embodiments, illustrative embodiments will be illustrated in the drawings and described in detail in the written description. Hereinafter, effects and features of the disclosure and a method for accomplishing them will be described more fully with reference to the accompanying drawings, in which embodiments of the disclosure are shown. This disclosure may, however, be embodied in many different forms and should not be construed as limited to the embodiments set forth herein.

In an embodiment below, terms, such as "first" and "second," are used herein merely to describe a variety of elements, but the elements are not limited by the terms. Such terms are used only for the purpose of distinguishing one element from another element.

In an embodiment below, an expression used in the singular encompasses the expression of the plural, unless it has a clearly different meaning in the context.

In an embodiment below, terms, such as "include" or "comprise," may be construed to denote a certain characteristic or element, or a combination thereof, but may not be construed to exclude the existence of or a possibility of addition of one or more other characteristics, elements, or combinations thereof.

It will be understood that when a layer, region, element is referred to as being "formed on" another layer, region, or element, it can be directly or indirectly formed on the other layer, region, or element. That is, for example, intervening layers, regions, or elements may be present, for example.

Sizes of elements in the drawings may be exaggerated or reduced for convenience of explanation. Sizes and thicknesses of the elements in the drawings are randomly indicated for convenience of explanation, for example, and thus, the disclosure is not necessarily limited to the illustrations of the drawings.

In the disclosure, "A and/or B" may include "A," "B," or "A and B." In addition, in the disclosure, "at least one of A and B" may include "A," "B," or "A and B."

In the following disclosure, it will be understood that when a line is referred to as "extending in a first direction or a second direction," it may not only extend in a linear shape, but also may extend in the first direction or the second direction in a zigzag or curved line.

In the following embodiments, when referred to "in a plan view," it means when an object is viewed from above, and when referred to "sectional," it means when a cross section defined by vertically cutting an object is viewed from the side. In the following embodiments, when a first element "overlaps" a second element, it may denote that the first element is located over or under the second element.

FIG. 1 is a diagram schematically illustrating an embodiment of a display apparatus.

The display apparatus according to embodiments may be implemented as an electronic apparatus, such as smartphones, mobile phones, navigation devices, game consoles, televisions ("TVs"), head units for vehicles, notebook computers, laptop computers, tablet computers, personal media players ("PMPs"), and personal digital assistants ("PDAs"). In addition, the electronic apparatus may be a flexible apparatus.

A substrate 100 may be divided into a display area DA on which an image is displayed, and a peripheral area PA around the display area DA.

The substrate 100 may include various materials, such as glass, metal, or plastic. In an embodiment, the substrate 100 may include a flexible material. Here, the flexible material refers to a substrate that is bendable, foldable, or rollable. The substrate 100 of such a flexible material may include ultra-thin glass, metal, or plastic.

In the display area DA of the substrate 100, a pixel PX including various display elements, such as an organic light-emitting diode, may be disposed. The pixel PX may include a plurality of pixels, and the plurality of pixels PX may be arranged in various shapes, such as a stripe arrangement, a PenTile™ arrangement, and a mosaic arrangement, to implement an image.

In a plan view, the display area DA may have a quadrangular (e.g., rectangular) shape, as shown in FIG. 1. In another embodiment, the display area DA may have a polygonal shape, such as a triangle, a pentagon, or a hexagon, a circular shape, an elliptical shape, and an amorphous shape.

The peripheral area PA of the substrate 100 is an area around the display area DA, in which an image may not be displayed. In the peripheral area PA, various lines, which transfer electrical signals to be applied to the display area DA, and pads to which a printed circuit board or a driver integrated circuit ("IC") chip is attached may be disposed.

Hereinafter, a display apparatus including an organic light-emitting diode as a display element is described below, for convenience. However, embodiments may also be applied to display apparatuses of various types, such as liquid crystal display apparatuses, electrophoresis display apparatuses, and inorganic electroluminescent ("EL") display apparatuses.

Figure 2:
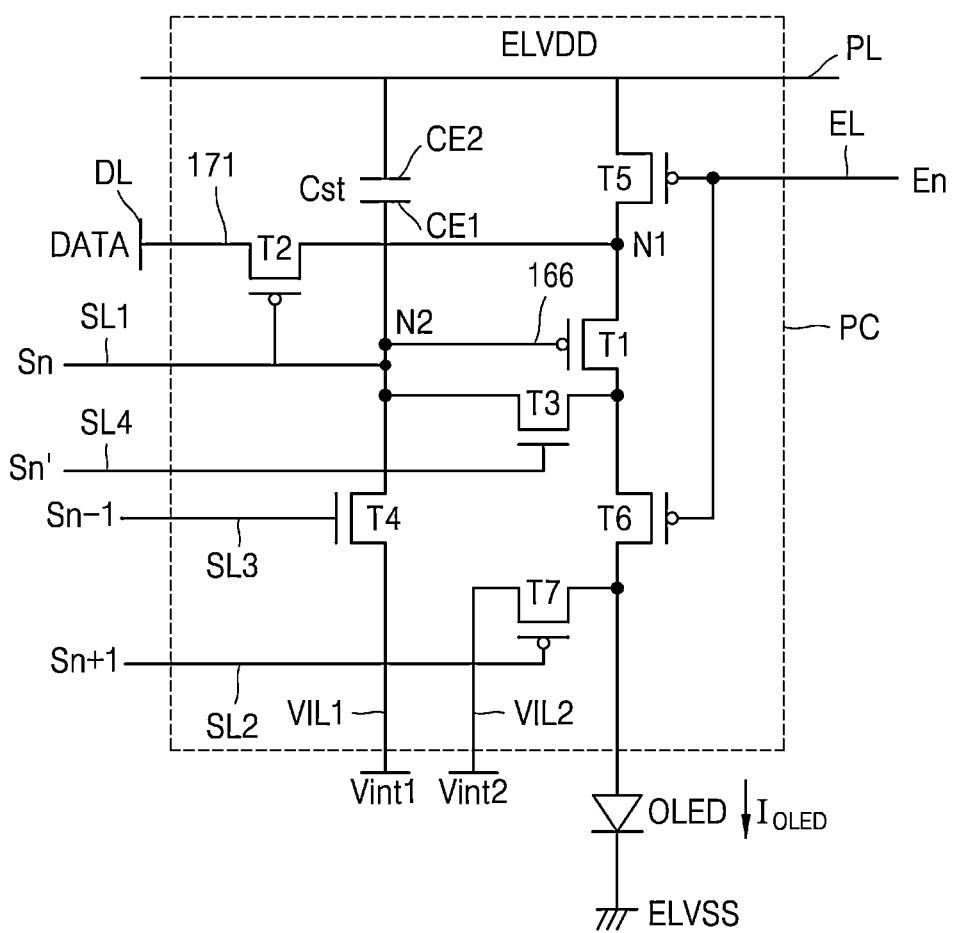
FIG. 2 is an equivalent circuit diagram illustrating an embodiment of a pixel.

FIG. 2 is an equivalent circuit diagram of an embodiment of a pixel circuit PC which drives a pixel and an organic light-emitting diode connected thereto.

Referring to FIG. 2, the pixel circuit PC may include a plurality of transistors T1, T2, T3, T4, T5, T6, and T7 and a capacitor Cst. In addition, the pixel circuit PC may be connected to a plurality of signal lines, first and second initialization voltage lines VIL1 and VIL2, and a power voltage line PL. The signal lines may include a data line DL, a first scan line SL1, a second scan line SL2, a third scan line SL3, a fourth scan line SL4, and an emission control line EL. In another embodiment, at least one of the signal lines, the first and second initialization voltage lines VIL1 and VIL2, and/or the power voltage line PL may be shared by neighboring pixel circuits.

The power voltage line PL may transfer a first power voltage ELVDD to the driving transistor T1. The first initialization voltage line VIL1 may transfer, to the pixel circuit PC, a first initialization voltage Vint1 for initializing the driving transistor T1. The second initialization voltage line VIL2 may transfer, to the pixel circuit PC, a second initialization voltage Vint2 for initializing the organic light-emitting diode OLED.

The first scan line SL1, the second scan line SL2, the third scan line SL3, the fourth scan line SL4, the emission control line EL, and the first and second initialization voltage lines VIL1 and VIL2 may extend in a first direction (x direction) and be arranged apart from each other in each row. The data line DL and the power voltage line PL may extend in a second direction (y direction) and be arranged apart from each other in each column.

In FIG. 2, from among the plurality of transistors T1 to T7, the compensation transistor T3 and the first initialization transistor T4 are implemented as n-channel metal-oxide semiconductor field-effect transistors ("n-channel MOSFET"), and the remaining ones are implemented as p-channel MOSFETs. In an embodiment, the switching transistor T2 and the emission control transistor T6 are provided as p-channel MOSFETs, and the first initialization transistor may be provided as an n-channel MOSFET.

The driving transistor T1 may be connected to the power voltage line PL through the operation control transistor T5 and connected to the organic light-emitting diode OLED through the emission control transistor T6. The driving transistor T1 may receive a data signal DATA in response to a switching operation of the switching transistor T2 and supply a driving current $I_{OLED}$ to the organic light-emitting diode OLED.

The switching transistor T2 may be connected to the first scan line SL1 and the data line DL, and may be connected to the power voltage line PL through the operation control transistor T5. The switching transistor T2 may be turned on in response to a first scan signal Sn received via the first scan line SL1 and perform a switching operation for transmitting the data signal DATA received via the data line DL to a node N1.

The compensation transistor T3 may be connected to the fourth scan line SL4, and may be connected to the organic light-emitting diode OLED through the emission control transistor T6. The compensation transistor T3 may be turned on in response to a fourth scan signal Sn' received via the fourth scan line SL4, and diode-connect the driving transistor T1.

The first initialization transistor T4 may be connected to the third scan line SL3, which is a previous scan line, and the first initialization voltage line VIL1, and may be turned on in response to a third scan signal Sn−1, which is a previous scan signal received via the third scan line SL3, and transfer a first initialization voltage Vint1 from the first initialization voltage line VIL1 to a gate electrode of the driving transistor T1, so as to initialize a voltage of the gate electrode of the driving transistor T1.

The operation control transistor T5 and the emission control transistor T6 may be connected to the emission control line EL, and may be simultaneously turned on in response to an emission control signal En received via the emission control line EL and form a current path so that the driving current $I_{OLED}$ may flow in a direction toward the organic light-emitting diode OLED from the power voltage line PL.

The second initialization transistor T7 may be connected to the second scan line SL2, which is a next scan line, and the second initialization voltage line VIL2, and may be turned on in response to a second scan signal Sn+1, which is a next scan signal received via the second scan line SL2, and transfer the second initialization voltage Vint2 from the second initialization voltage line VIL2 to the organic light-emitting diode OLED, so as to initialize the organic light-emitting diode OLED. In an alternative embodiment, the second initialization transistor T7 may be omitted.

The capacitor Cst may include a first electrode CE1 and a second electrode CE2. The first electrode CE1 may be connected to the gate electrode of the driving transistor T1, and the second electrode CE2 may be connected to the power voltage line PL. The capacitor Cst may store and maintain a voltage corresponding to a voltage difference between the power voltage line PL and the gate electrode of the driving transistor T1, so that a voltage applied to the gate electrode of the driving transistor T1 may be maintained.

A boosting capacitor may be added between the switching transistor T2 and a node N2.

The organic light-emitting diode OLED may include a pixel electrode 310 (refer to FIG. 13) and an opposite electrode 330 (refer to FIG. 13), and the opposite electrode 330 may receive a second power voltage ELVSS. The organic light-emitting diode OLED may receive the driving current $I_{OLED}$ from the driving transistor T1 and emit light, to display an image.

A detailed operation of each pixel circuit PC in an embodiment is described below.

During a first initialization period, when the third scan signal Sn−1 is supplied via the third scan line SL3, the first initialization transistor T4 may be turned on in response to the third scan signal Sn−1, and the driving transistor T1 may be initialized by the first initialization voltage Vint1 supplied from the first initialization voltage line VIL1.

During a data programming period, when the first scan signal Sn and the fourth scan signal Sn' are respectively supplied via the first scan line SL1 and the fourth scan line SL4, the switching transistor T2 and the compensation transistor T3 may be turned on in response to the first scan signal Sn and the fourth scan signal Sn'. In this case, the driving transistor T1 may be diode-connected by the turned-on compensation transistor T3, and biased in a forward direction. Then, in the data signal DATA supplied from the data line DL, a voltage that is compensated for a threshold voltage Vth of the first transistor T1 is applied to the gate electrode of the first transistor T1. The first power voltage ELVDD and the compensation voltage may be respectively applied to opposite ends of the capacitor Cst, and a charge corresponding to a voltage difference between the opposite ends of the capacitor Cst may be stored in the capacitor Cst.

During an emission period, the operation control transistor T5 and the emission control transistor T6 may be turned on according to the emission control signal En supplied from the emission control line EL. The driving current $I_{OLED}$ according to a voltage difference between a voltage of the gate electrode of the driving transistor T1 and the first power voltage ELVDD may be generated, and the driving current $I_{OLED}$ may be supplied to the organic light-emitting diode OLED through the emission control transistor T6.

During a second initialization period, when a second scan signal Sn+1 is supplied through the second scan line SL2, the second initialization transistor T7 may be turned on in response to the second scan signal Sn+1, and the organic light-emitting diode OLED may be initialized by the second initialization voltage Vint2 supplied from the second initialization voltage line VIL2.

In the illustrated embodiment, at least one of the plurality of transistors T1 to T7 may include a semiconductor layer including an oxide, and the remaining transistor(s) may include a semiconductor layer including silicon. In an embodiment, the driving transistor, which directly affects a brightness of the display apparatus, includes a semiconductor layer including polycrystalline silicon having substantially high reliability, for example, so that a high-resolution display apparatus may be implemented.

Because an oxide semiconductor has substantially high carrier mobility and substantially low leakage current, a voltage drop is not substantially large even when a driving time is increased. In other words, a color change of an image according to the voltage drop is not substantially large even when the display apparatus is driven at substantially low frequencies, and thus, the display apparatus may be driven at substantially low frequencies. As the oxide semiconductor has an advantage of substantially low leakage current, as described above, at least one of the compensation transistor T3 and the first initialization transistor T4, which are connected to the gate electrode of the driving transistor T1, may be used as the oxide semiconductor, so as to prevent leakage current that may flow to the gate electrode of the driving transistor T1 and simultaneously, reduce power consumption.

Figure 3:
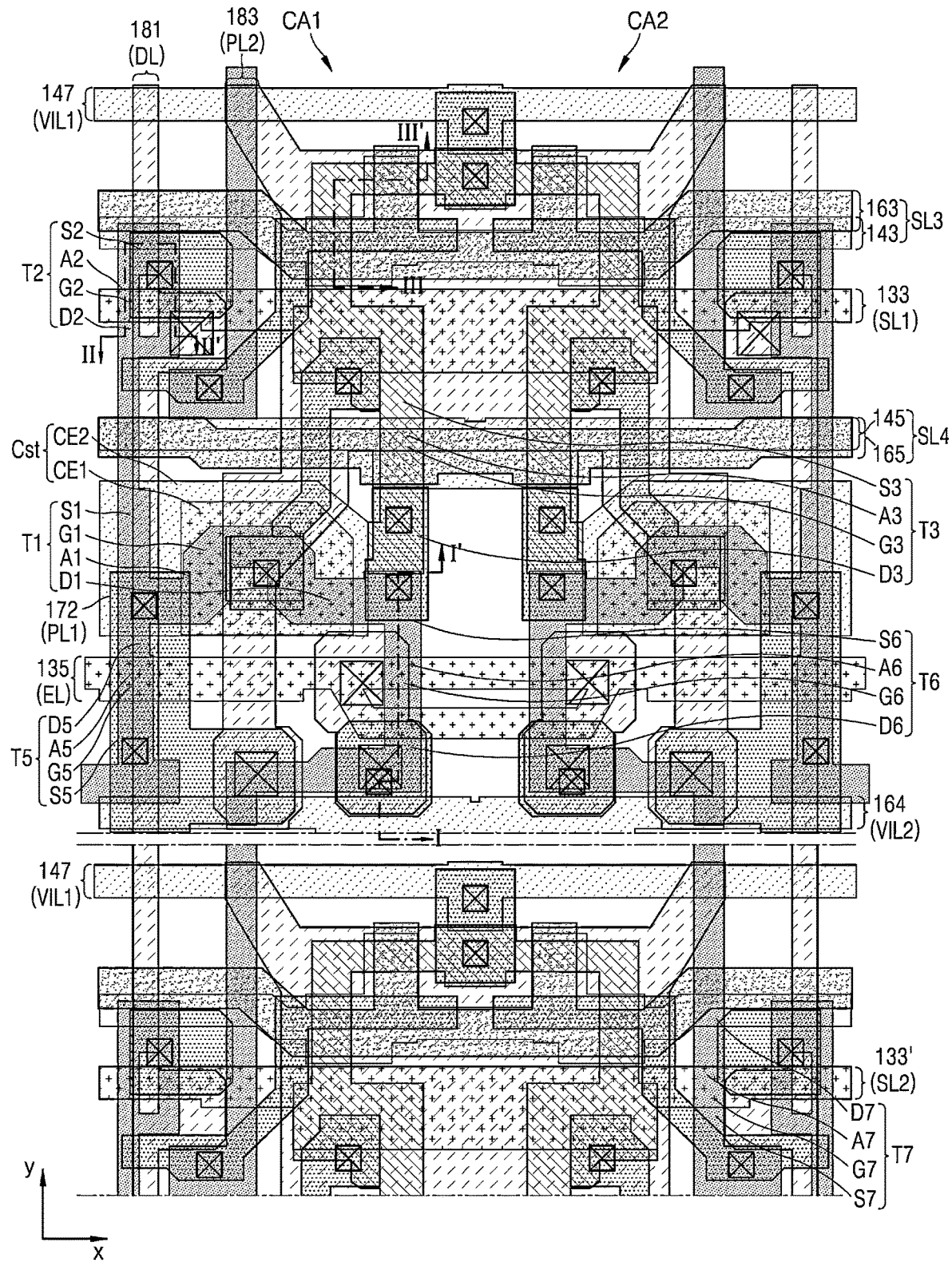
FIG. 3 is a layout diagram schematically illustrating an embodiment of positions of a plurality of thin-film transistors and capacitors in a pair of pixel circuits of a display apparatus.

FIG. 3 is a layout diagram schematically illustrating an embodiment of positions of a plurality of thin-film transistors and capacitors in a pair of pixel circuits PC of a display apparatus.

In FIG. 3, the pair of pixel circuits PC arranged in a same row in adjacent columns are shown. A pixel circuit of a pixel disposed in a left pixel area CA1 and a pixel circuit of a pixel disposed in a right pixel area CA2 shown in FIG. 3 have a symmetric structure to each other.

Referring to FIG. 3, the pixel circuit of the display apparatus in an embodiment may include a first scan line 133, a second scan line 133', the third scan line SL3, the fourth scan line SL4, an emission control line 135, and an initialization voltage line, which each extend in a first direction (x direction), and a data line 181 and power voltage lines 172 and 183, which each extend in a second direction (y direction) crossing the first direction (x direction). The initialization voltage line may include a first initialization voltage line 147 and a second initialization voltage line 164.

In addition, the pixel circuit may include the driving transistor T1, the switching transistor T2, the compensation transistor T3, the first initialization transistor T4, the operation control transistor T5, the emission control transistor T6, the second initialization transistor T7, and the capacitor Cst.

In an embodiment, each of the driving transistor T1, the switching transistor T2, the operation control transistor T5, the emission control transistor T6, and the switching transistor T2 may be provided in a thin-film transistor including a silicon semiconductor. Each of the compensation transistor T3 and the first initialization transistor T4 may be provided in a thin-film transistor including an oxide semiconductor.

The second scan line 133' may be the first scan line SL1 of a next row. In other words, the first scan line 133 shown in FIG. 3 may be the second scan line SL2 of a previous row. In FIG. 3, the second initialization transistor T7 connected to a pixel of a previous row and disposed in a pixel area of a row and the second initialization transistor T7 connected to a pixel of the row and disposed in a pixel area of a next row are shown together.

Semiconductor layers of the driving transistor T1, the switching transistor T2, the operation control transistor T5, the emission control transistor T6, and the second initialization transistor T7 may be arranged in a same layer and may include a same material. In an embodiment, the semiconductor layers may each include a polycrystalline silicon, for example. The semiconductor layers of the driving transistor T1, the switching transistor T2, the operation control transistor T5, the emission control transistor T6, and the second initialization transistor T7 may be connected to each other and curved in various shapes.

Each of the semiconductor layers of the driving transistor T1, the switching transistor T2, the operation control transistor T5, the emission control transistor T6, and the second initialization transistor T7 may include a channel area, a source area, and a drain area, the source area and the drain area being at opposite sides of the channel area. In an embodiment, the source area and the drain area may be doped with impurities, and the impurities may include an n-type impurity or a p-type impurity, for example. The source area and the drain area may correspond to a source electrode and a drain electrode, respectively. The source area and the drain area may be switched to each other depending on the characteristics of the transistor. Hereinafter, the terms "source area" and "drain area" are used instead of the terms "source electrode" or "drain area."

The driving transistor T1 may include a first semiconductor layer and a first gate electrode G1. The first semiconductor layer may include a first channel area A1, a first source area S1, and a first drain area D1, the first source area S1 and the first drain area D1 being at opposite sides of the first channel area A1. The first semiconductor layer may have a curved shape, and the first channel area A1 may be greater in length than each of lengths of the other channel areas A2 to A7. In an embodiment, because the first semiconductor layer has a shape that is bent a plurality of times, such as "ㄱ," "ㄹ," "S," "M," or "W," a channel having a substantially large length may be formed in a narrow space. Because the first channel area A1 has a substantially large length, a driving range of a gate voltage applied to the first channel area A1 increases, a gradation of light emitted by the organic light-emitting diode OLED may be more precisely controlled, and the display quality may be improved, for example. In some embodiments, the first semiconductor layer may be provided in a straight line shape instead of a bent shape. The first gate electrode G1, which is of an island type, may be provided to overlap the first channel area A1 with a first gate insulating layer 112 (refer to FIG. 13) therebetween.

The capacitor Cst may overlap the driving transistor T1. The capacitor Cst may include the first electrode CE1 and the second electrode CE2. The first gate electrode G1 may function not only as a control electrode of the driving transistor T1, but also as the first electrode CE1 of the capacitor Cst. In other words, the first gate electrode G1 and the first electrode CE1 may be unitary as a single body. The second electrode CE2 of the capacitor Cst may be provided to overlap the first electrode CE1 with a second gate insulating layer 113 (refer to FIG. 13) therebetween. In this case, the second gate insulating layer 113 may serve as a dielectric layer of the capacitor Cst.

A node connection line 171 (refer to FIG. 11) may be electrically connected to the first electrode CE1 and a third semiconductor layer of the compensation transistor T3. The second electrode CE2 may be electrically connected to a first power voltage line 172, and the first power voltage line 172 may be electrically connected to a second power voltage line 183. The first power voltage line 172 and the second power voltage line 183 may each extend in the second direction (y direction). The second electrode CE2 may extend in the first direction (x direction) and transfer the first power voltage ELVDD in the first direction (x direction). Accordingly, in the display area DA, the plurality of first power voltage lines 172, the plurality of second power voltage line 183, and the plurality of second electrodes CE2 may form a mesh structure.

The switching transistor T2 may include a second semiconductor layer AS2 (refer to FIG. 13) and a second gate electrode G2. The second semiconductor layer AS2 may include a second channel area A2, a second source area S2, and a second drain area D2, the second source area S2 and the second drain area D2 being at opposite sides of the second channel area A2. The second source area S2 may be electrically connected to the data line 181, and the second drain area D2 may be connected to the first source area S1. The second gate electrode G2 may be provided as part of the first scan line 133. The second gate electrode G2 may be provided as a dual gate electrode. When the second gate electrode G2 is provided in the dual gate electrode, it may denote that the second gate electrodes G2 are connected in parallel to each other. This is described in detail later.

The operation control transistor T5 may include a fifth semiconductor layer and a fifth gate electrode G5. The fifth semiconductor layer may include a fifth channel area A5, a fifth source area S5, and a fifth drain area D5, the fifth source area S5 and the fifth drain area D5 being at opposite sides of the fifth channel area A5. The fifth source area S5 may be electrically connected to the first power voltage line 172, and the fifth drain area D5 may be connected to the first source area S1. The fifth gate electrode G5 may be provided as part of the emission control line 135.

The emission control transistor T6 may include a sixth semiconductor layer AS6 (refer to FIG. 13) and a sixth gate electrode G6. The sixth semiconductor layer AS6 may include a sixth channel area A6, a sixth source area S6, and a sixth drain area D6, the sixth source area S6 and the sixth drain area D6 being at opposite sides of the sixth channel area A6. The sixth source area S6 may be connected to the first drain area D1, and the sixth drain area D6 may be electrically connected to a pixel electrode 310 (refer to FIG. 13) of the organic light-emitting diode OLED. The sixth gate electrode G6 may be provided as part of the emission control line 135 and may include a dual gate electrode. When the sixth gate electrode G6 is provided as a dual gate electrode, it may denote that the emission control transistors T6 are connected in series to each other. This is described in detail later.

The second initialization transistor T7 may include a seventh semiconductor layer and a seventh gate electrode G7. The seventh semiconductor layer may include a seventh channel area A7, a seventh source area S7, and a seventh drain area D7, the seventh source area S7 and the seventh drain area D7 being at opposite sides of the seventh channel area A7. The seventh source area S7 may be electrically connected to the second initialization voltage line 164, and the seventh drain area D7 may be connected to the sixth drain area D6. The seventh gate electrode G7 may be provided as part of the second scan line 133'.

A first inter-insulating layer 114 (refer to FIG. 13) may be disposed on the transistors T1, T2, T5, T6, and T7 each including a silicon semiconductor, and the compensation and first initialization transistors T3 and T4 each including an oxide semiconductor may be disposed on the first inter-insulating layer 114.

Semiconductor layers of the compensation transistor T3 and the first initialization transistor T4 may be arranged in a same layer and may include a same material. In an embodiment, the semiconductor layer may include an oxide semiconductor, for example.

The semiconductor layer may include a channel area, a source area, and a drain area, the source area and the drain area being at opposite sides of the channel area. In an embodiment, the source area and the drain area may be areas of which carrier concentrations are increased by plasma treatment, for example. The source area and the drain area may correspond to a source electrode and a drain electrode, respectively. Hereinafter, the terms "source area" and "drain area" are used instead of the terms "source electrode" or "drain area."

The compensation transistor T3 may include a third semiconductor layer, which includes an oxide semiconductor, and a third gate electrode G3. The third semiconductor layer may include a third channel area A3, a third source area S3, and a third drain area D3, the third source area S3 and the third drain area D3 being at opposite sides of the third channel area A3. The third source area S3 may be bridge-connected to the first gate electrode G1 through the node connection line 171. In addition, the third source area S3 may be connected to a fourth drain area D4 disposed in the same layer in which the third source area S3 is disposed. The third drain area D3 may be electrically connected to the first semiconductor layer of the driving transistor T1 and the sixth semiconductor layer of the emission control transistor T6. The third gate electrode G3 may be provided as part of the fourth scan line SL4.

The first initialization transistor T4 may include a fourth semiconductor layer AO4 (refer to FIG. 13), which includes an oxide semiconductor, and a fourth gate electrode G4. The fourth semiconductor layer AO4 may include a fourth channel area A4, a fourth source area S4, and the fourth drain area D4, the fourth source area S4 and the fourth drain area D4 being at opposite sides of the fourth channel area A4. The fourth source area S4 may be electrically connected to the first initialization voltage line 147, and the fourth drain area D4 may be bridge-connected to the first gate electrode G1 through the node connection line 171. The fourth gate electrode G4 may be provided as part of the third scan line SL3 and may include a dual gate electrode. When the fourth gate electrode G4 is provided as a dual gate electrode, it may denote that the first initialization transistors T4 are connected in series to each other. This is described in detail later.

A third gate insulating layer 115 (refer to FIG. 13) may be disposed between the third semiconductor layer and the third gate electrode G3 and between the fourth semiconductor layer AO4 and the fourth gate electrode G4, so as to correspond to the respective channel areas.

A second inter-insulating layer 116 (refer to FIG. 13) may be disposed on the transistors T3 and T4 each including an oxide semiconductor, and the first power voltage line 172 and the node connection line 171 may be disposed over the second inter-insulating layer 116.

A first planarization layer 118 (refer to FIG. 13) may be disposed over the first power voltage line 172, and the data line 181 and the second power voltage line 183 may be disposed over the first planarization layer 118 to extend in the second direction (y direction).

In an embodiment, the first scan line 133, the second scan line 133', and the emission control line 135 may be provided in a same layer in which the first gate electrode G1 is disposed, and may include the same material.

In an embodiment, some of the lines may be provided in two conductive layers disposed in different layers from each other. In an embodiment, the third scan line SL3 may include a lower scan line 143 and an upper scan line 163 in different layers from each other, for example. The lower scan line 143 and the second electrode CE2 of the capacitor Cst may be provided in a same layer and may include a same material. The upper scan line 163 may be disposed over the third gate insulating layer 115. The lower scan line 143 may at least partially overlap the upper scan line 163. Because the lower scan line 143 and the upper scan line 163 correspond to a part of the third gate electrode of the compensation transistor T3, the compensation transistor T3 may have a dual gate structure having a control electrode both over and under the semiconductor layer.

In addition, the fourth scan line SL4 may include a lower scan line 145 and an upper scan line 165 in different layers from each other. The lower scan line 145 and the second electrode CE2 of the capacitor Cst may be provided in a same layer and may include a same material. The upper scan line 165 may be disposed over the third gate insulating layer 115. The lower scan line 145 may at least partially overlap the upper scan line 165. Because the lower scan line 145 and the upper scan line 165 correspond to part of the fourth gate electrode G4 of the first initialization transistor T4, the first initialization transistor T4 may have a dual gate structure having a control electrode both over and under the semiconductor layer.

The initialization voltage line VIL may include the first initialization voltage line 147 and the second initialization voltage line 164 in different layers from each other. The first initialization voltage line 147 and the second electrode CE2 of the capacitor Cst may be provided in a same layer and may include a same material. The second initialization voltage line 164 and the first power voltage line 172 may be provided in a same layer and may include a same material.

FIGS. 4 to 12 are layout diagrams schematically illustrating elements in FIG. 3, for each layer. FIG. 13 is a schematic cross-sectional view of the display apparatus, taken along lines I-I', II-II', and III-III'.

Figure 4:
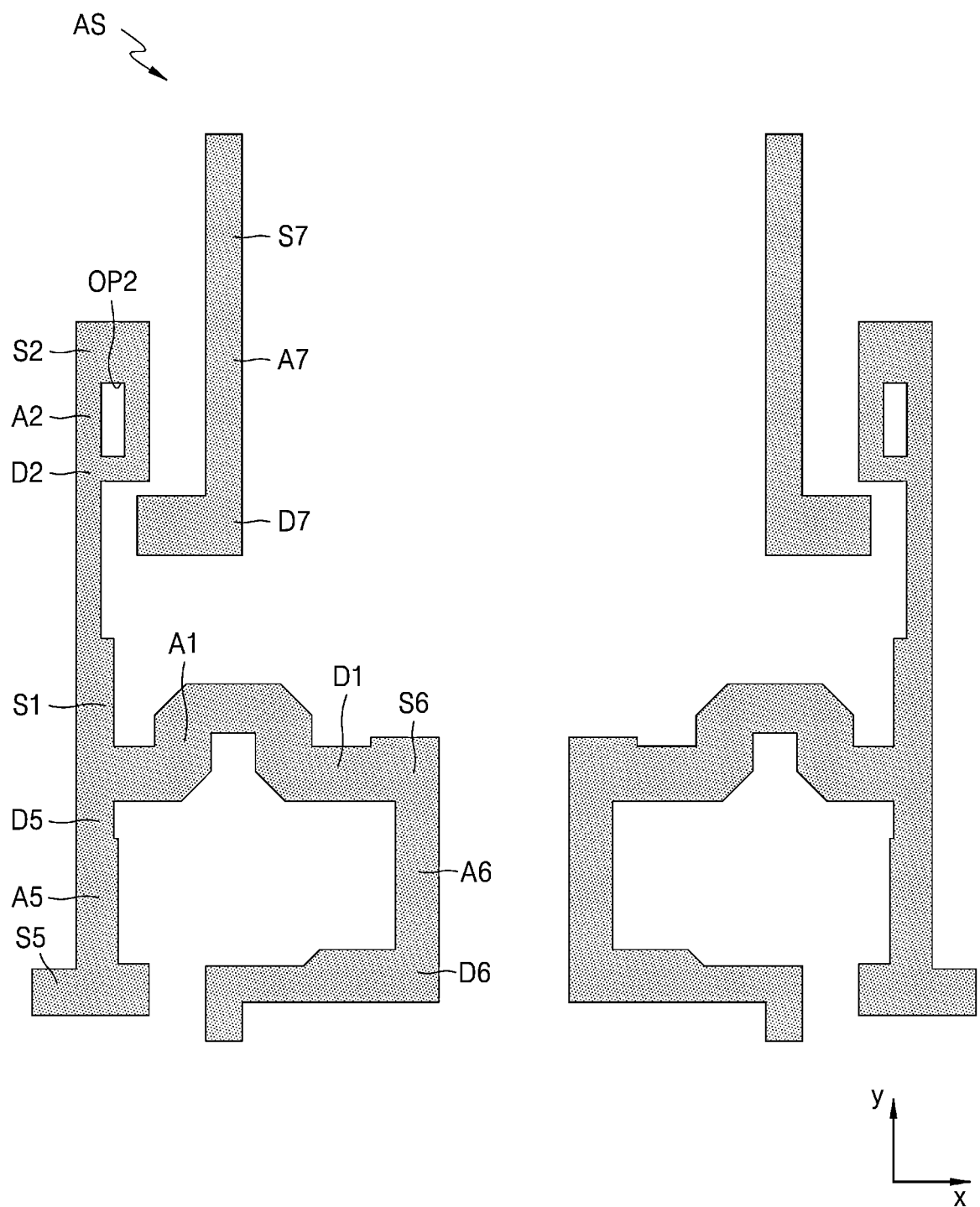
FIGS. 4 to 12 are layout diagrams schematically illustrating elements in FIG. 3, for each layer.

Referring to FIG. 4, a semiconductor layer AS may include a channel area A1, a source area S1, and a drain area D1, which are included in a semiconductor layer of the driving transistor T1, a channel area A2, a source area S2, and a drain area D2, which are included in a semiconductor layer AS2 (refer to FIG. 13) of the switching transistor T2, a channel area A5, a source area S5, and a drain area D5, which are included in a semiconductor layer of the operation control transistor T5, a channel area A6, a source area S6, and a drain area D6, which are included in a semiconductor layer AS6 of the emission control transistor T6, and a channel area A7, a source area S7, and a drain area D7, which are included in a semiconductor layer of the second initialization transistor T7. In other words, each of the channel areas, the source areas, and the drain areas of the transistors T1, T2, T5, T6, and T7 may be part of the semiconductor layer AS. In an embodiment, the semiconductor layer AS6 of the emission control transistor T6 and the semiconductor layer AS2 of the switching transistor T2 may be integrally provided as a single body.

Figure 5:
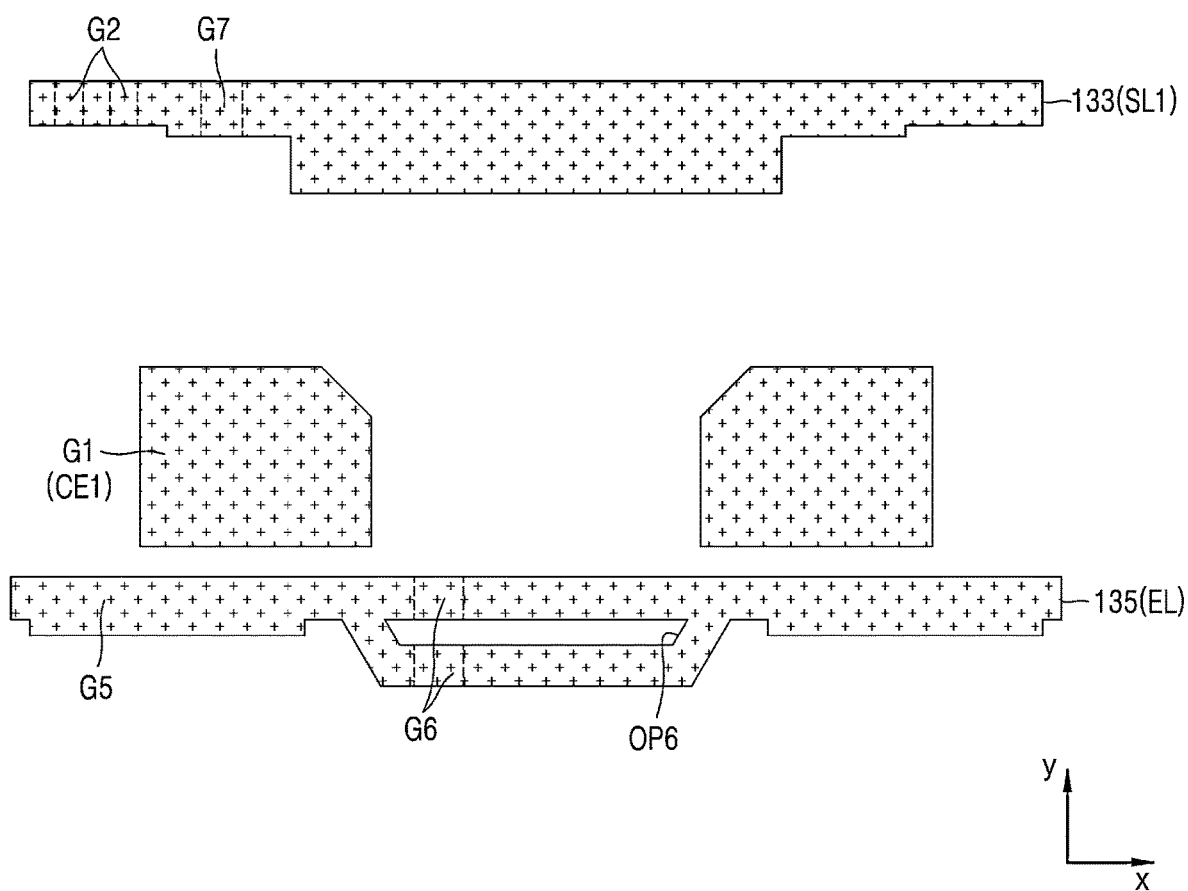

As shown in FIG. 5, the gate electrode G1 of the driving transistor T1, the gate electrode G2 of the switching transistor T2, the gate electrode G5 of the operation control transistor T5, the gate electrode G6 of the emission control transistor T6, and the gate electrode G7 of the second initialization transistor T7 may be disposed over the first gate insulating layer 112 (refer to FIG. 13). In addition, the first scan line 133 and the emission control line 135 may be disposed over the first gate insulating layer 112 to extend in the first direction (x direction).

The gate electrode G1 of the driving transistor T1 may be provided of an island type. The gate electrode G2 of the switching transistor T2 may be part of the first scan line 133 crossing the semiconductor layer AS. The gate electrode G7 of the second initialization transistor T7 may be part of the first scan line 133 crossing the semiconductor layer AS or part of the second scan line 133' (refer to FIG. 3) that is a first scan line of a next row. In FIG. 5, the gate electrode G7 of the second initialization transistor T7 of a pixel arranged in a previous row is part of the first scan line 133 crossing the semiconductor layer AS. The gate electrode G5 of the operation control transistor T5 and the gate electrode G6 of the emission control transistor T6 may be parts of the emission control line 135 crossing the semiconductor layer AS.

The gate electrode G1 of the driving transistor T1 may function not only as a control electrode of the driving transistor T1, but also as the first electrode CE1 of the capacitor Cst.

Each of the gate electrodes G1, G2, G5, G6, and G7 of the driving transistor T1, the switching transistor T2, the operation control transistor T5, the emission control transistor T6, and the second initialization transistor T7 may include aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), or copper (Cu), and may include a layer or layers of one or more of the materials.

Figure 6:
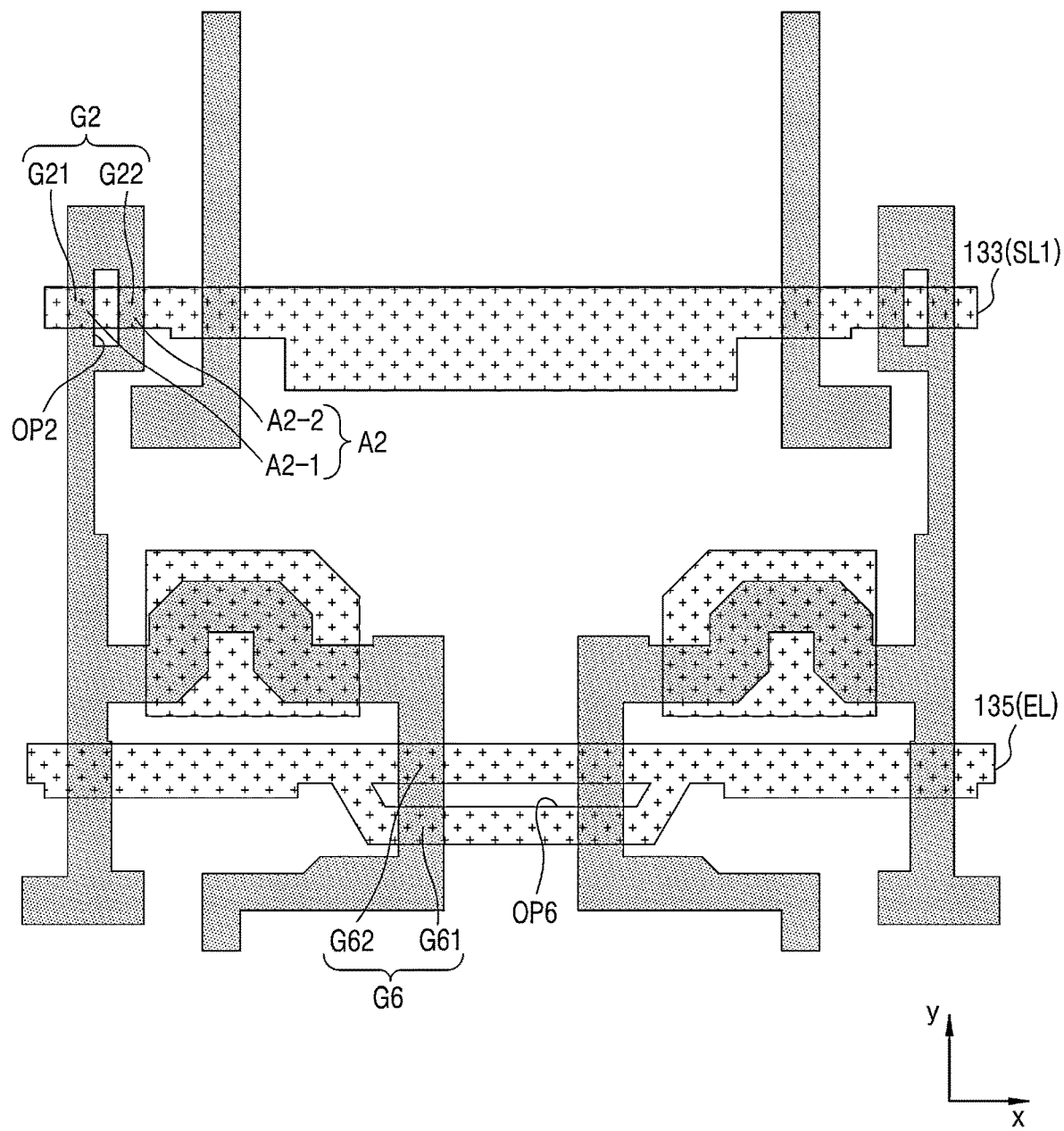

FIG. 6 is a diagram in which FIGS. 4 and 5 overlap each other.

In a foldable product, lines, circuits, or the like may be damaged by external shock, and accordingly, a bright spot may occur on a display screen. In an embodiment, when a line in the switching transistor T2 is opened due to an external shock or when a line in the emission control transistor T6 is shorted due to an external shock, a bright spot may be displayed on the display screen, for example.

In the illustrated embodiments, each of the gate electrode G2 of the switching transistor T2 and the gate electrode G6 of the emission control transistor T6 may be a dual gate electrode, so as to significantly reduce a probability that a bright spot will occur, and simultaneously, to reduce an off current in the data programming period and minimize a leakage current.

The display apparatus in an embodiment includes the driving transistor T1, the emission control transistor T6, the switching transistor T2, the first initialization transistor T4, the emission control line 135, and a first signal line, and each of the emission control transistor T6 and the switching transistor T2 may include a dual gate electrode.

Referring to FIG. 6, the first signal line may be the first scan line 133. An opening OP2 may be defined in the semiconductor layer AS2 of the switching transistor T2. The first scan line 133 may overlap each of a $2^{nd}$-$1^{st}$ semiconductor layer and a $2^{nd}$-$2^{nd}$ semiconductor layer, which are separated from each other by the opening OP2. The $1^{st}$ semiconductor layer and the $2^{nd}$-$2^{nd}$ semiconductor layer may be a $2^{nd}$-$1^{st}$ channel area A2-1 and a $2^{nd}$-$2^{nd}$ channel area A2-2, respectively. The first scan line 133 in the overlapped portions may be a first switching gate electrode G21 and a second switching gate electrode G22, respectively. Accordingly, the switching transistor T2 may include a dual gate electrode. In an embodiment, when the switching transistor T2 includes the first switching gate electrode G21 and the second switching gate electrode G22, it may denote that the switching transistors T2 are connected in parallel to each other.

The opening OP2 of the semiconductor layer AS2 of the switching transistor T2 may have a quadrangular (e.g., rectangular) shape, other various shapes, or a shape with a closed opening or an open side. In addition, the opening OP2 may be provided in plural.

In a case in which the switching transistor T2 includes a single gate electrode, when an open occurs in the switching transistor T2 due to an external shock and the gate electrode does not operate, this may be displayed as a bright spot on the display screen. Unlike the above, in an embodiment, when the switching transistor T2 includes a dual gate electrode such that the switching transistors T2 are connected in parallel to each other, even when one gate electrode is opened due to an external shock, the switching transistor T2 may operate through the other gate electrode, and thus, a probability of the switching transistor T2 will be opened, that is, a probability that a bright spot will appear on the display screen, may be reduced.

In addition, referring to FIG. 6, the emission control line 135 may partially overlap the semiconductor layer AS6 of the emission control transistor T6. An opening OP6 may be defined in the emission control line 135 in an area overlapping the semiconductor layer AS6. The gate electrode G6 of the emission control transistor T6 may be provided as part of the emission control transistor T6 crossing the semiconductor layer AS6. In other words, the gate electrode G6 of the emission control transistor T6 may be provided as a dual gate electrode including a first emission control gate electrode G61 and a second emission control gate electrode G62 that are obtained by branching by the opening OP6 of the emission control line 135. In an embodiment, when the emission control transistor T6 includes the first emission control gate electrode G61 and the second emission control gate electrode G62, it may denote that the emission control transistors T6 are connected in series to each other.

A shape of the opening OP6 of the emission control line 135 may not only be a trapezoid, but also have various shapes, such as a quadrangle and a circle, and may have a shape with a lateral side open.

In a case in which the emission control transistor T6 includes a single gate electrode, when a short occurs in the emission control transistor T6 due to an external shock such that the gate electrode does not operate, this may be displayed as a bright spot on the display screen.

Unlike the above, in an embodiment, when the emission control transistor T6 includes the dual gate electrode G61 and G62 such that the emission control transistors T6 are connected in series to each other, even when one gate electrode is shorted, the other gate electrode may operate, and thus, a probability that the emission control transistor T6 will be shorted, that is, a probability that a bright spot will be displayed on the display screen, may be reduced. In addition, even when the other gate electrode is opened, connection to the pixel electrode of the organic light-emitting diode is released, and thus, this may be displayed as a dark spot. In other words, a defect due to a bright spot occurs only when all gate electrodes included in the emission control transistor T6 are shorted, and thus, a probability that a bright spot will be displayed due to an external shock may be significantly reduced.

Figure 7:
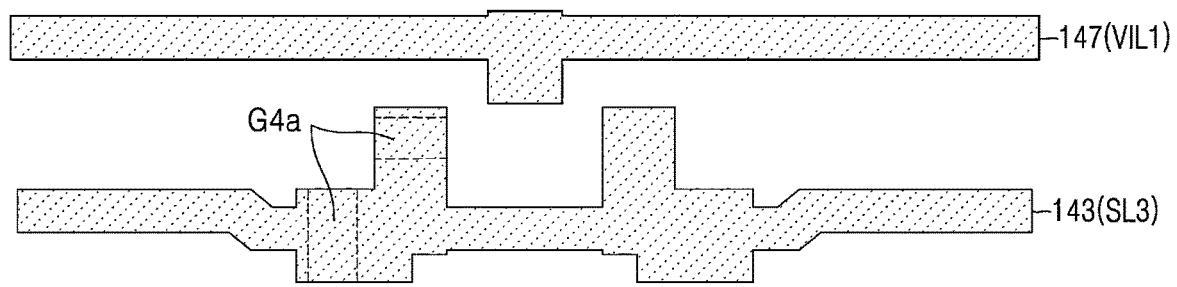
Figure 7:
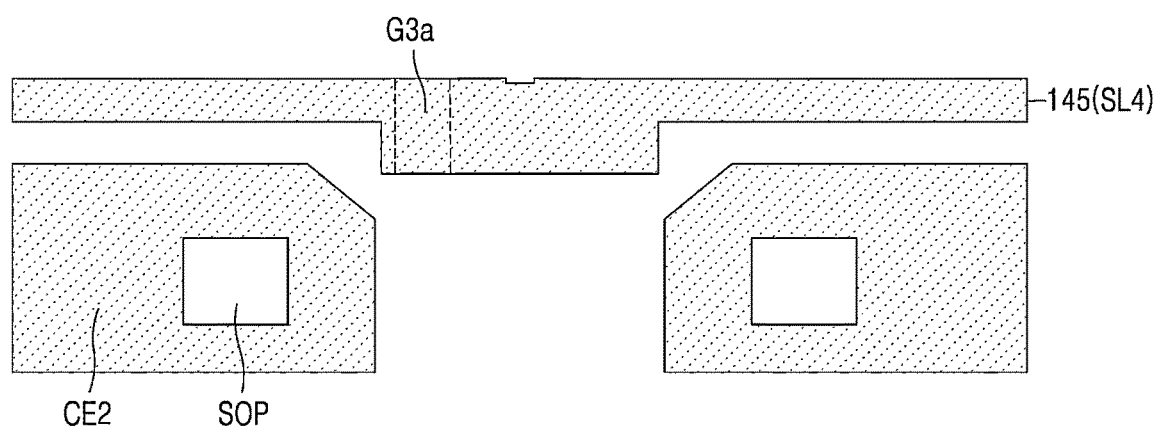
Figure 7:
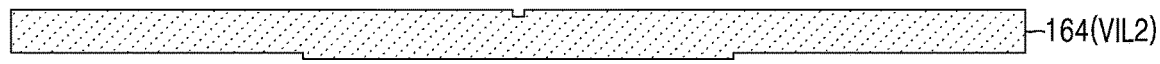
Figure 7:
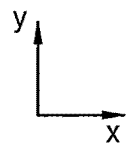

As shown in FIG. 7, the second electrode CE2 may be disposed on the second gate insulating layer 113 (refer to FIG. 13) to overlap the first electrode CE1. An opening SOP may be defined in the second electrode CE2. The opening SOP is defined by removing part of the second electrode CE2 and may have a closed shape.

The second gate insulating layer 113 may serve as a dielectric layer of the capacitor Cst. The second electrode CE2 of the capacitor Cst may include a layer or layers of at least one material from among Al, Pt, Pd, Ag, Mg, Au, NI, Nd, Ir, Cr, Li, Ca, Mo, Ti, W, and Cu.

In addition, the first initialization voltage line 147, the second initialization voltage line 164, the lower scan line 143 of the third scan line SL3, and the lower scan line 145 of the fourth scan line SL4, which include a same material as that of the second electrode CE2 of the capacitor Cst, may be disposed on the second gate insulating layer 113 to extend in the first direction (x direction). A portion of the lower scan line 143 of the third scan line SL3 that overlaps a semiconductor layer AO4 may be a lower gate electrode G4a of the first initialization transistor T4. The lower gate electrode G4a may include a dual gate electrode. This is described in detail later. A portion of the lower scan line 145 of the fourth scan line SL4 that overlaps a semiconductor layer AO may be a lower gate electrode G3a of the compensation transistor T3.

Figure 8:
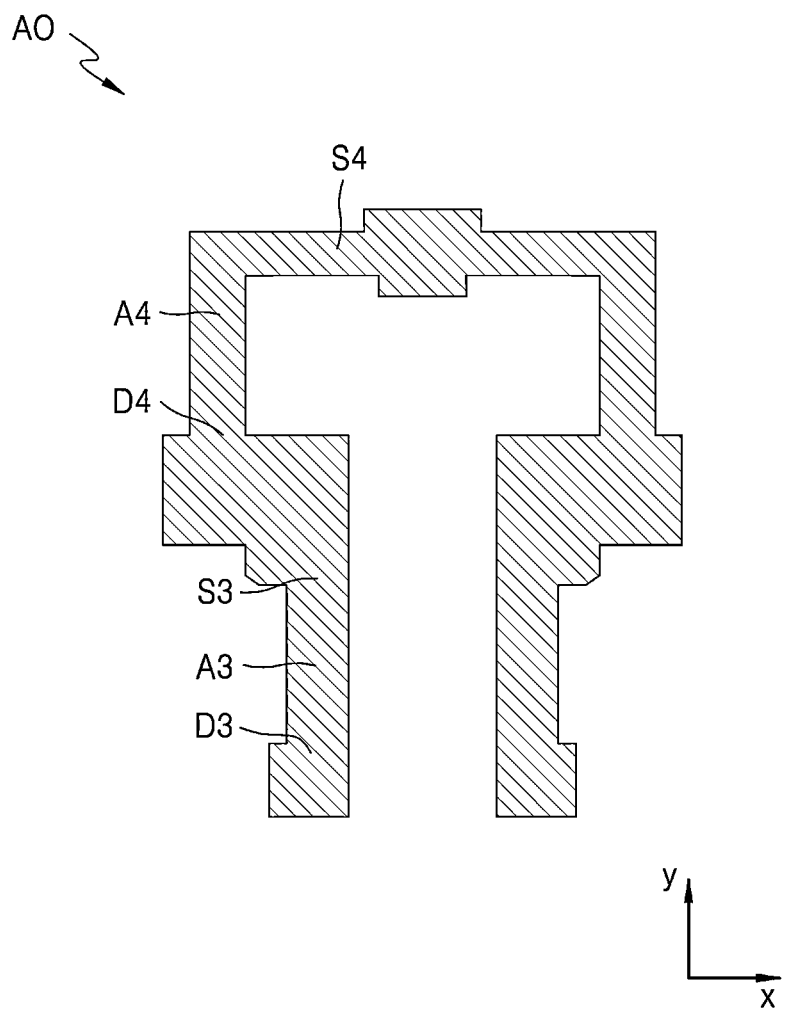

As shown in FIG. 8, the semiconductor layer AO including an oxide semiconductor may be disposed on the first inter-insulating layer 114 (refer to FIG. 13). The semiconductor layer AO may include a zinc oxide (Zn) oxide-based material, such as a zinc (Zn) oxide, an indium-zinc (In—Zn) oxide, a gallium-indium-zinc (Ga—In—Zn) oxide, or the like. In some embodiments, the semiconductor layer AO may include an In—Ga—Zn—O ("IGZO"), In—Sn—Zn—O ("ITZO"), or In—Ga—Sn—Zn—O ("IGTZO") semiconductor, in which a metal, such as In, Ga, or Sn, is contained in zinc oxide (ZnO).

Each of the semiconductor layers of the compensation transistor T3 and the first initialization transistor T4 may include a channel area, a source area, and a drain area, the source area and the drain area being at opposite sides of the channel area. The source areas and the drain areas of the compensation transistor T3 and the first initialization transistor T4 may be defined by adjusting a carrier concentration of an oxide semiconductor to make the oxide semiconductor conductive. In an embodiment, the source areas and the drain areas of the compensation transistor T3 and the first initialization transistor T4 may be defined by increasing a carrier concentration through plasma treatment on the oxide semiconductor by hydrogen (H)-based gas, fluorine (F)-based gas, or any combinations thereof, for example.

The semiconductor layer AO may include a channel area A3, a source area S3, and a drain area D3, which are included in a third semiconductor layer AO3 of the compensation transistor T3, and a channel area A4, a source area S4, and a drain area D4, which are included in the fourth semiconductor layer AO4 of the first initialization transistor T4. In other words, each of the channel areas, the source areas, and the drain areas of the compensation transistor T3 and the first initialization transistor T4 may be part of the semiconductor layer AO. The source area S4 of the first initialization transistor T4 may overlap the first initialization voltage line 147.

Figure 9:
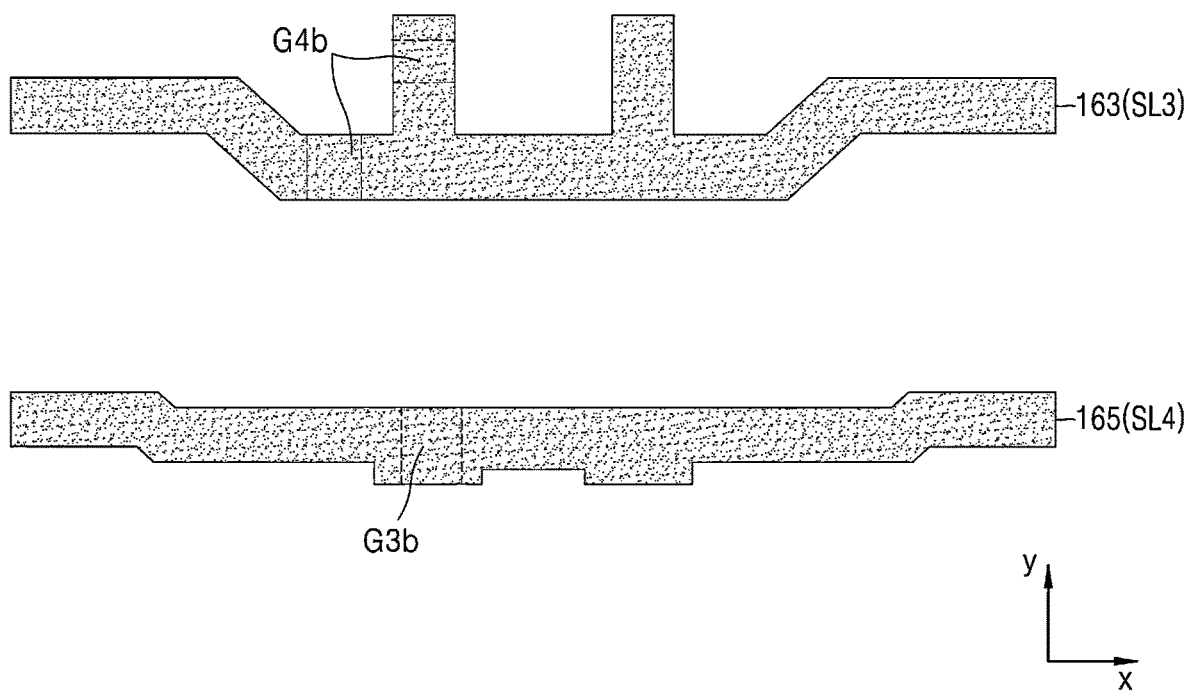

As shown in FIG. 9, the upper scan line 163 of the third scan line SL3 and the upper scan line 165 of the fourth scan line SL4 may be disposed on the semiconductor layer AO to extend in the first direction (x direction). In some embodiments, the third scan line SL3 and the fourth scan line SL4 may be provided in two layers disposed in different layers from each other.

A portion of the upper scan line 163 of the third scan line SL3 that overlaps the fourth semiconductor layer AO4 may be an upper gate electrode G4b of the first initialization transistor T4. The upper gate electrode G4b may include a dual gate electrode. This is described in detail later. A portion of the upper scan line 165 of the fourth scan line SL4 that overlaps the third semiconductor layer AO3 may be an upper gate electrode G3b of the compensation transistor T3.

In other words, the compensation transistor T3 and the first initialization transistor T4 may have a dual gate structure having a control electrode both over and under a semiconductor layer.

Figure 10:
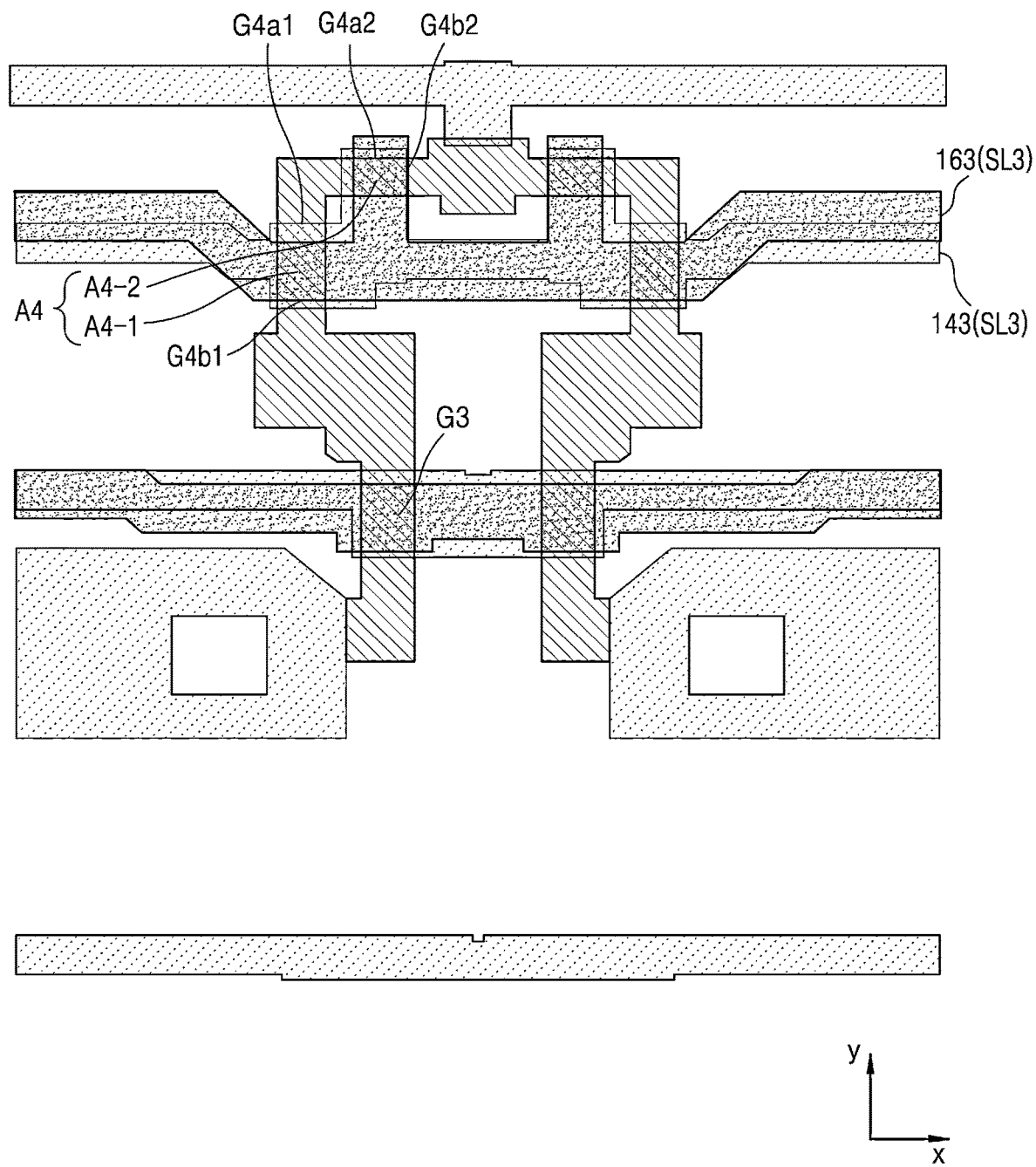

FIG. 10 is a diagram in which FIGS. 7, 8, and 9 overlap each other.

Referring to FIG. 10, the upper scan line 163 of the third scan line SL3 may at least partially overlap the lower scan line 143. The upper scan line 165 of the fourth scan line SL4 may at least partially overlap the lower scan line 145.

The display apparatus in an embodiment may include the substrate 100 including a display area on which a display element is disposed, the emission control transistor T6 including a silicon oxide and connected to the pixel electrode 310 of the organic light-emitting diode OLED, the switching transistor T2 including a silicon semiconductor, and the first initialization transistor T4 including an oxide semiconductor. At least one of the emission control transistor T6, the switching transistor T2, and the first initialization transistor T4 may include a dual gate electrode.

Referring to FIG. 10, in an embodiment, the display apparatus may include a second signal line that partially overlaps the semiconductor layer AO4 of the first initialization transistor T4. The second signal line may be the third scan line SL3. The fourth gate electrode G4 of the first initialization transistor T4 may be a portion of the third scan line SL3 that overlaps the semiconductor layer AO4 of the first initialization transistor T4. The third scan line SL3 may overlap each of a $3^{rd}$-$1^{st}$ semiconductor layer and a $3^{rd}$-$2^{nd}$ semiconductor layer. The $3^{rd}$-$1^{st}$ semiconductor layer and the $3^{rd}$-$2^{nd}$ semiconductor layer may respectively be a $4^{th}$-$1^{st}$ channel area A4-1 and a $4^{th}$-$2^{nd}$ channel area A4-2 of the first initialization transistor T4.

The third scan line SL3 of the overlapped portion may be the fourth gate electrode G4 of the first initialization transistor T4. Accordingly, the first initialization transistor T4 may include a dual gate electrode. When the first initialization transistor T4 includes a dual gate electrode, it may denote that the first initialization transistors T4 are connected in series to each other.

Referring to FIG. 10, the third scan line SL3 may include the lower scan line 143 and the upper scan line 163 in different layers from each other. Accordingly, the first initialization transistor T4 may include the lower gate electrode G4a and the upper gate electrode G4b. In an embodiment, at least one of the lower gate electrode G4a and the upper gate electrode G4b may be provided as a dual gate electrode.

In an embodiment, the upper scan line 163 disposed over the semiconductor layer AO4 of the first initialization transistor T4 may overlap the $4^{th}$-$1^{st}$ channel area A4-1 and the $4^{th}$-$2^{nd}$ channel area A4-2 included in the semiconductor layer AO4, for example, so that the upper scan line 163 may be provided as a dual gate electrode G4b1 and G4b2. Similarly, the lower scan line 143 disposed under the semiconductor layer AO4 may overlap the $4^{th}$-$1^{st}$ channel area A4-1 and the $4^{th}$-$2^{nd}$ channel area A4-2 included in the semiconductor layer AO4, so that the lower scan line 143 may be provided as a dual gate electrode G4a1 and G4a2.

When the first initialization transistor T4 is shorted due to an external shock, a bright spot may be displayed on the display screen. In an embodiment, because the lower gate electrode G4a and the upper gate electrode G4b of the first initialization transistor T4 are provided as a dual gate electrode, that is, because the first initialization transistors T4 are connected in series to each other, a probability that the dual gate electrode will be shorted may be reduced. In an embodiment, even when one of the gate electrodes is shorted, the display apparatus may be normally operated by the other remaining gate electrode, for example. In addition, because a dark spot is also displayed when the other gate electrode is opened, and a bright spot is displayed only when all gate electrodes are shorted, defects due to an external shock may be reduced.

Figure 11:
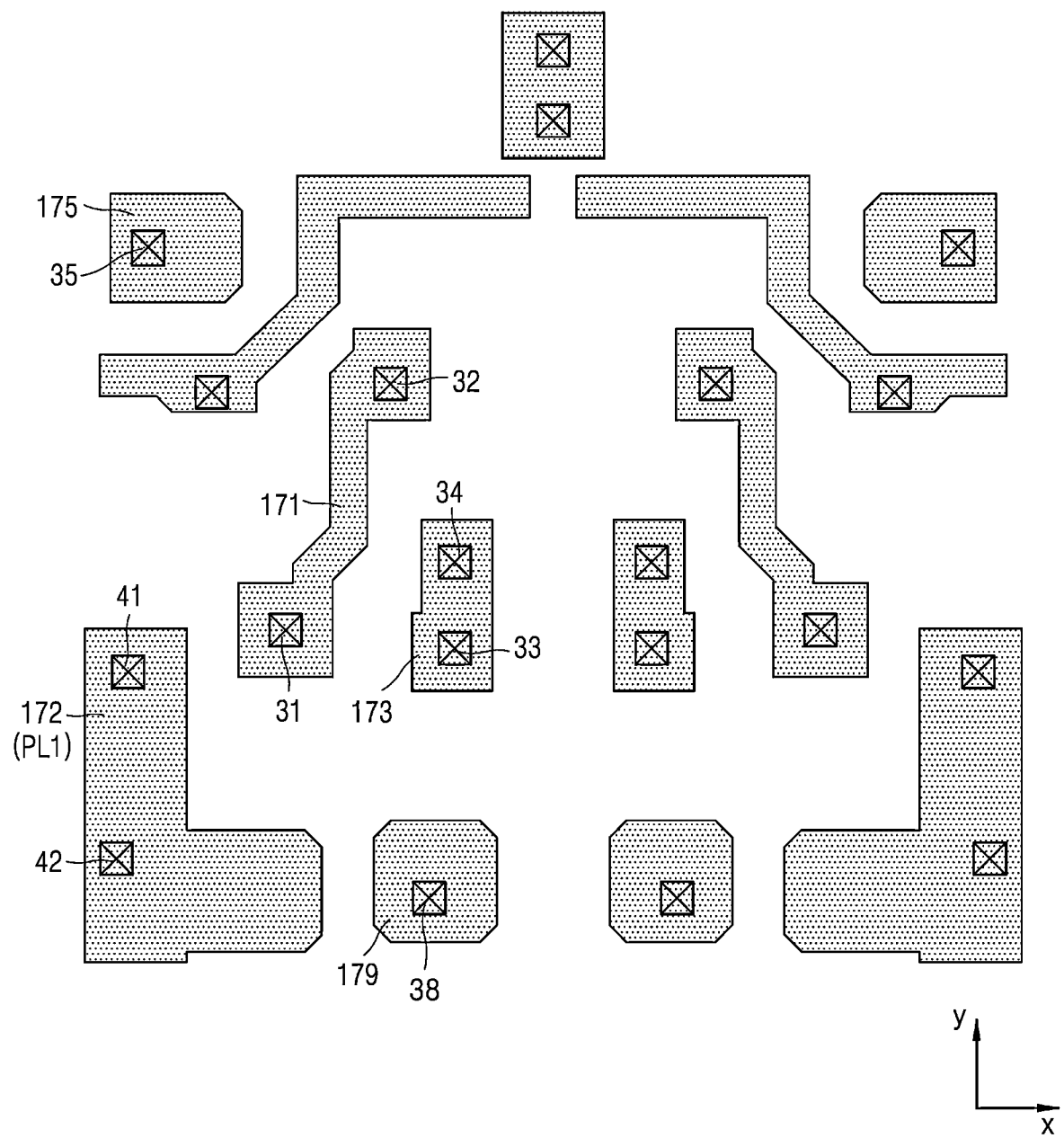

Referring to FIG. 11, the first power voltage line 172, the node connection line 171, and connection electrodes 173, 175, and 179 may be disposed over the second inter-insulating layer 116 (refer to FIG. 13).

The first power voltage line 172, the node connection line 171, and the connection electrodes 173, 175, and 179 may include a material having substantially high conductivity, such as metal or a conductive oxide. In an embodiment, the first power voltage line 172, the node connection line 171, and the connection electrodes 173, 175, and 179 may include a layer or layers including at least one of Al, Cu, and Ti, for example. In some embodiments, the first power voltage line 172, the node connection line 171, and the connection electrodes 173, 175, and 179 may be provided in a three-layer of a Ti, Al, and Ti that are sequentially stacked.

The first power voltage line 172 may be connected to the second electrode CE2 of the capacitor Cst through a contact hole 41 defined in the first inter-insulating layer 114 and the second inter-insulating layer 116. The first power voltage line 172 may be connected to the fifth drain area D5 of the operation control transistor T5 through a contact hole 42 defined in the first gate insulating layer 112, the second gate insulating layer 113, the first inter-insulating layer 114, and the second inter-insulating layer 116.

One end of the node connection line 171 may be connected to the first gate electrode G1 through a contact hole 31. The contact hole 31 may pass through the second inter-insulating layer 116, the first inter-insulating layer 114, and the second gate insulating layer 113, and expose the first gate electrode G1. Part of the node connection line 171 may be inserted into the contact hole 31 and electrically connected to the first gate electrode G1. An opposite end of the node connection line 171 may be connected to the third semiconductor layer of the compensation transistor T3 through a contact hole 32.

The contact hole 31 may be defined in the opening SOP of the second electrode CE2 to be apart from an edge of the opening SOP, and the node connection line 171 inserted into the contact hole 31 may be electrically insulated from the second electrode CE2.

One end of the connection electrode 173 may be connected to the first drain area D1 of the driving transistor T1 and the sixth source area S6 of the emission control transistor T6 through a contact hole 33. The contact hole 33 may pass through the first gate insulating layer 112, the second gate insulating layer 113, the first inter-insulating layer 114, and the second inter-insulating layer 116, and expose a silicon semiconductor layer. The other end of the connection electrode 173 may be connected to the third drain area D3 of the compensation transistor T3 through a contact hole 34. The contact hole 34 may pass through the second inter-insulating layer 116 and expose an oxide semiconductor layer.

The connection electrode 175 may be connected to the second source area S2 of the switching transistor T2 through a contact hole 35 defined in the second gate insulating layer 113, the first inter-insulating layer 114, and the second inter-insulating layer 116.

The connection electrode 179 may be connected to the drain area D6 of the emission control transistor T6 through a contact hole 38 defined in the second gate insulating layer 113, the first inter-insulating layer 114, and the second inter-insulating layer 116.

Figure 12:
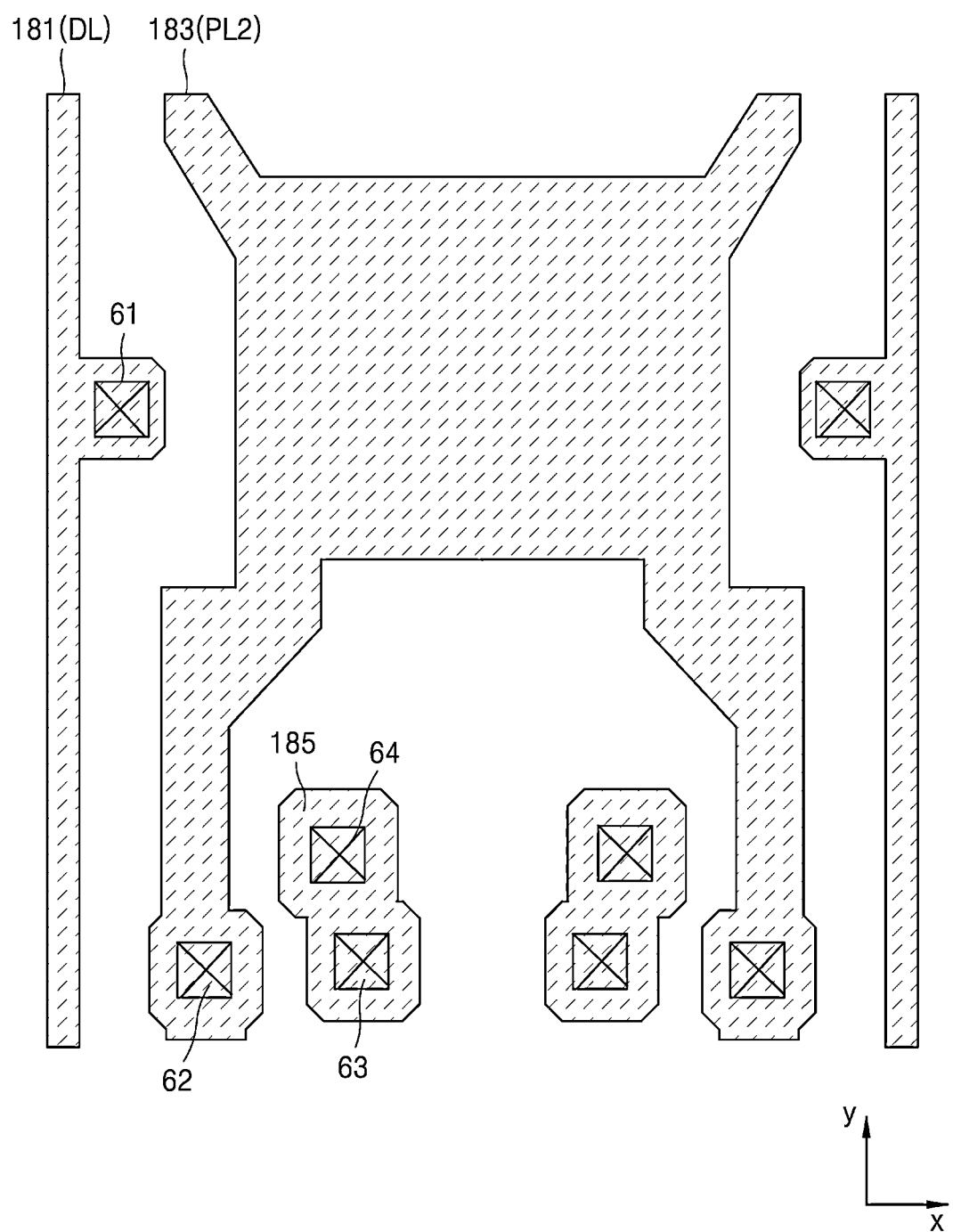
Figure 13:
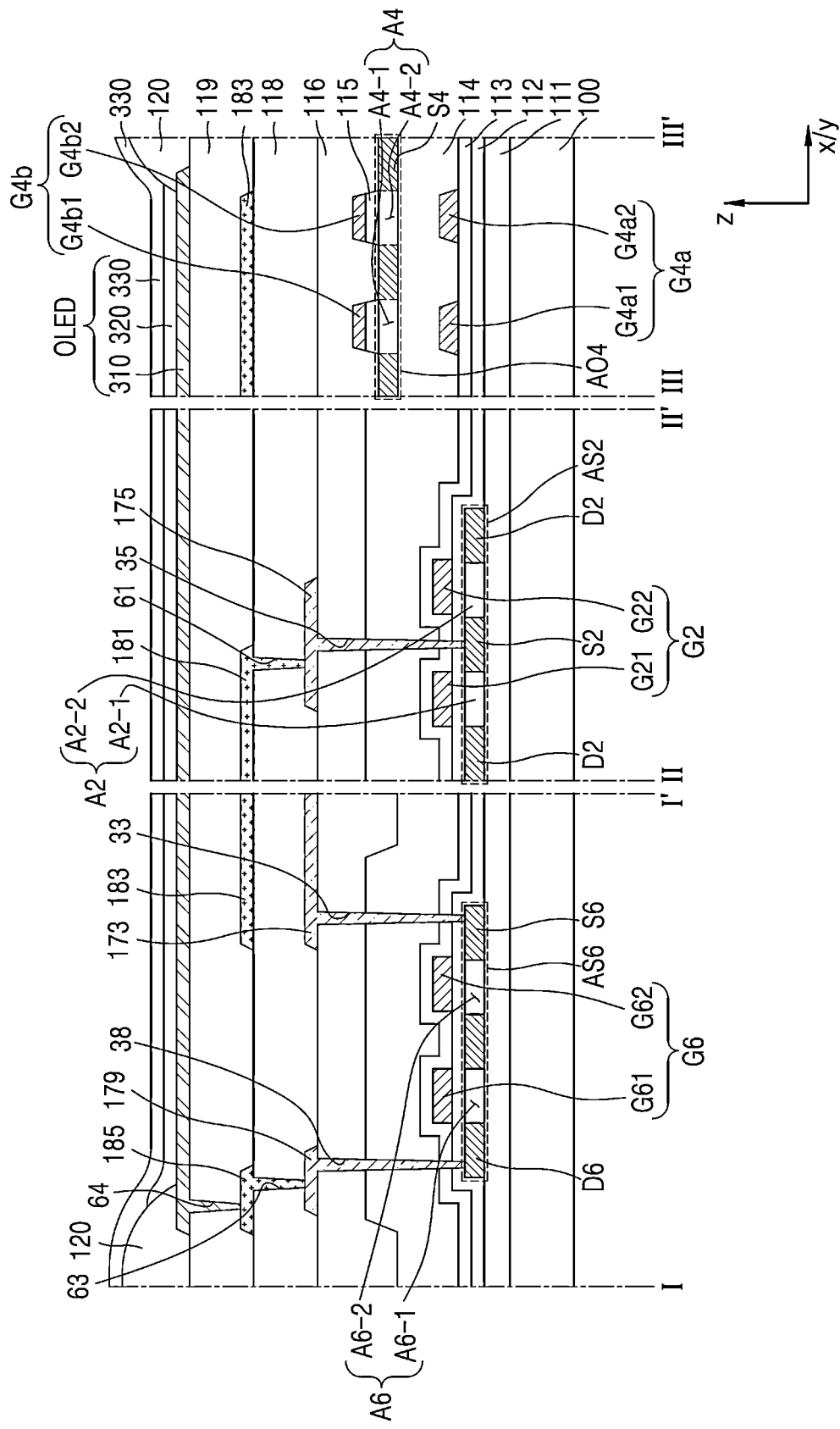
FIG. 13 is a schematic cross-sectional view of the display apparatus, taken along lines I-I', II-II', and III-III'.

Referring to FIG. 12, the data line 181, the second power voltage line 183, and a connection electrode 185 may be disposed on the first planarization layer 118.

The data line 181 may be connected to the connection electrode 175 through a contact hole 61 defined in the first planarization layer 118, so as to be connected to the second source area S2 of the switching transistor T2. The data line 181 may at least partially overlap the first power voltage line 172. In a cross-sectional view, the first power voltage line 172 may be disposed between the first gate electrode G1 of the driving transistor T1 and the data line 181. In a plan view, a part of the first power voltage line 172 may be disposed between the data line 181 and the node connection line 171. Accordingly, the first power voltage line 172 may reduce coupling between the node connection line 171 and the first gate electrode G1 and between the node connection line 171 and the data line 181.

The second power voltage line 183 may be connected to the first power voltage line 172 through a contact hole 62 defined in the first planarization layer 118. The second power voltage line 183 may cover the third semiconductor layer AO3 of the compensation transistor T3 and the fourth semiconductor layer AO4 of the first initialization transistor T4. Accordingly, light that may be applied from an upper portion of the substrate 100 may be blocked. In addition, a portion of the second power voltage line 183 may overlap the node connection line 171. In a plan view, another portion of the second power voltage line 183 may be disposed between the data line 181 and the node connection line 171. Accordingly, the second power voltage line 183 may reduce coupling between the node connection line 171 and the data line 181.

The connection electrode 185 is connected to the connection electrode 179 through a contact hole 63 defined in the first planarization layer 118, and may thereby be connected to the drain area D6 of the emission control transistor T6. The connection electrode 185 may be connected to the pixel electrode 310 through a contact hole 64 defined in a second planarization layer 119 over the first planarization layer 118, and transfer a signal received through the emission control transistor T6 to the pixel electrode 310.

FIG. 13 shows cross-sections of portions corresponding to the switching transistor T2, the first initialization transistor T4, the emission control transistor T6, and the organic light-emitting diode OLED shown in FIG. 3.

A structure of the display apparatus in an embodiment is described in detail with reference to FIG. 13, according to a stacking order.

The substrate 100 may include a glass material, a ceramic material, a metal material, plastic, or a material that is flexible or bendable. When the substrate 100 is flexible or bendable, the substrate 100 may include a polymer resin, such as polyethersulfone ("PES"), polyacrylate, polyetherimide ("PEI"), polyethylene naphthalate ("PEN"), polyethylene terephthalate ("PET"), polyphenylene sulfide ("PPS"), polyarylate, polyimide ("PI"), polycarbonate ("PC"), or cellulose acetate propionate ("CAP").

The substrate 100 may include a layer or layers of the material described above, and when the substrate 100 includes layers, the substrate 100 may further include an inorganic layer. In an embodiment, the substrate 100 may include a first organic base layer, a first inorganic barrier layer, a second organic base layer, and a second inorganic barrier layer, for example. Each of the first organic base layer and the second organic base layer may include a polymer resin. The first inorganic barrier layer and the second inorganic barrier layers, which are barrier layers for preventing permeation of external impurities, may include a layer or layers including an inorganic material, such as a silicon nitride ($SiN_x$) or a silicon oxide ($SiO_x$).

A buffer layer 111 may be disposed on the substrate 100. The buffer layer 111, which may increase flatness of the upper surface of the substrate 100, may include an oxide layer, such as $SiO_x$, and/or a nitride layer, such as $SiN_x$, or a silicon oxynitride ($SiO_xN_y$).

The semiconductor layers AS (refer to FIG. 4) of the switching transistor T2, the first initialization transistor T4, and the emission control transistor T6 may be disposed over the buffer layer 111.

The semiconductor layer AS may include the channel area A2, the source area S2, and the drain area D2, which are included in the semiconductor layer AS2 of the switching transistor T2, and the channel area A6, the source area S6, and the drain area D6, which are included in the semiconductor layer AS6 of the emission control transistor T6. In an embodiment, the semiconductor layer AS6 of the emission control transistor T6 and the semiconductor layer AS2 of the switching transistor T2 may be integrally provided as a single body.

The first gate insulating layer 112 may be disposed over the semiconductor layer AS. The first gate insulating layer 112 may include an inorganic material including an oxide or nitride. In an embodiment, the first gate insulating layer 112 may include at least one of silicon oxide ($SiO_2$), $SiN_x$, $SiO_xN_y$, aluminum oxide ($Al_2O_3$), titanium oxide ($TiO_2$), tantalum oxide ($Ta_2O_5$), hafnium oxide ($HfO_2$), and zinc oxide ($ZnO_2$), for example.

The gate electrode G2 of the switching transistor T2 and the gate electrode G6 of the emission control transistor T6 may be disposed on the first gate insulating layer 112. As described above, the gate electrode G2 of the switching transistor T2 may be provided as a dual gate electrode including the first switching gate electrode G21 and the second switching gate electrode G22. The gate electrode G6 of the emission control transistor T6 may be provided as a dual gate electrode including the first emission control gate electrode G61 and the second emission control gate electrode G62.

The second gate insulating layer 113 may be disposed over the gate electrodes G2 and G6. The second gate insulating layer 113 may include an inorganic material including an oxide or nitride. In an embodiment, the second gate insulating layer 113 may include at least one of $SiO_2$, $SiN_x$, $SiO_xN_y$, $Al_2O_3$, $TiO_2$, $Ta_2O_5$, $HfO_2$, and $ZnO_2$, for example.

The lower gate electrode G4a of the first initialization transistor T4 may be disposed on the second gate insulating layer 113. The lower gate electrode G4a may be provided as a dual gate electrode including the first initialization gate electrode G4a1 and the second initialization gate electrode G4a2.

The first inter-insulating layer 114 may be disposed on the second gate insulating layer 113. The first inter-insulating layer 114 may include an inorganic material including an oxide or nitride. In an embodiment, the first inter-insulating layer 114 may include at least one of $SiO_2$, $SiN_x$, $SiO_xN_y$, $Al_2O_3$, $TiO_2$, $Ta_2O_5$, $HfO_2$, and $ZnO_2$, for example.

The semiconductor layer AO including an oxide semiconductor may be disposed on the first inter-insulating layer 114. The semiconductor layer AO may include the channel area A4, the source area S4, and the drain area D4 in the fourth semiconductor layer AO4 of the first initialization transistor T4. Each of the channel area, the source area, and the drain area of the first initialization transistor T4 may be part of the semiconductor layer AO.

The third gate insulating layer 115 may be disposed on the semiconductor layer AO. The third gate insulating layer 115 may include an inorganic material including an oxide or nitride. In an embodiment, the third gate insulating layer 115 may include at least one of $SiO_2$, $SiN_x$, $SiO_xN_y$, $Al_2O_3$, $TiO_2$, $Ta_2O_5$, $HfO_2$, and $ZnO_2$, for example.

The third gate insulating layer 115 may be patterned in a form corresponding to the upper scan line 163 of the third scan line SL3 and the upper scan line 165 of the fourth scan line SL4. A portion of the upper scan line 163 of the third scan line SL3 that overlaps the fourth semiconductor layer AO4 may be the upper gate electrode G4b of the first initialization transistor T4.

The upper gate electrode G4b of the first initialization transistor T4 may be disposed on the third gate insulating layer 115, may include at least one of Mo, Cu, and Ti, and may include a layer or a plurality of layers. The upper gate electrode G4b may be provided in the dual gate electrode G4b1 and G4b2.

The second inter-insulating layer 116 may cover the first initialization transistor T4. The second inter-insulating layer 116 may be disposed over the upper gate electrode G4b of the first initialization transistor T4.

The second inter-insulating layer 116 may include an inorganic material including an oxide or nitride. In an embodiment, the second inter-insulating layer 116 may include at least one of $SiO_2$, $SiN_x$, $SiO_xN_y$, $Al_2O_3$, $TiO_2$, $Ta_2O_5$, $HfO_2$, and $ZnO_2$, for example.

The first power voltage line 172, the node connection line 171, and the connection electrodes 173, 175, and 179 may be disposed over the second inter-insulating layer 116.

The first planarization layer 118 may be disposed over the first power voltage line 172, the node connection line 171, and the connection electrodes 173, 175, and 179. The data line 181, the second power voltage line 183, and a connection electrode 185 may be disposed on the first planarization layer 118.

The connection electrode 185 may be connected to the pixel electrode 310 through the contact hole 64 defined in the second planarization layer 119 over the first planarization layer 118, and transfer a signal received via the emission control transistor T6 to the pixel electrode 310.

Each of the first planarization layer 118 and the second planarization layer 119 may include an organic material, such as acrylic, benzocyclobutene ("BCB"), PI, or hexamethyldisiloxane ("HMDSO"). In an alternative embodiment, each of the first planarization layer 118 and the second planarization layer 119 may include an inorganic material. The first planarization layer 118 and the second planarization layer 119 may serve as protective films covering the plurality of transistors T1 to T7, and upper portions of the first planarization layer 118 and the second planarization layer 119 may be provided to be flat. Each of the first planarization layer 118 and the second planarization layer 119 may be provided in a layer or layers.

A pixel-defining layer 120 may be disposed over the second planarization layer 119. An opening corresponding to each pixel, that is, an opening that exposes at least a central portion of the pixel electrode 310 may be defined in the pixel-defining layer 120, thereby defining a pixel. In addition, the pixel-defining layer 120 may increase a distance between an edge of the pixel electrode 310 and the opposite electrode 330 over the pixel electrode 310, to thereby prevent an arc or the like from occurring at the edge of the pixel electrode 310. The pixel-defining layer 120 may include an organic material, such as PI or HMDSO.

An intermediate layer 320 of the organic light-emitting diode OLED may include a low-molecular weight material or a polymer material. When the intermediate layer 320 includes a low-molecular weight material, the intermediate layer 320 may have a structure in which a hole injection layer ("HIL"), a hole transport layer ("HTL"), an emission layer ("EML"), an electron transport layer ("ETL"), and an electron injection layer ("EIL") are stacked in a single or composite structure, and may include various organic materials, such as copper phthalocyanine (CuPc), N,N'-Di(naphthalene-1-yl)-N,N'-diphenyl-benzidine ("NPB"), and tris-8-hydroxyquinoline aluminum (Alq3). These layers may be formed through vacuum deposition.

When the intermediate layer 320 includes a polymer material, the intermediate layer 320 may have a structure including mostly an HTL and an EML. In this case, the HTL may include poly-3,4-ethylene dioxy thiophene ("PEDOT"), and the emission layer may include a polymer material, such as a polyphenylene vinylene ("PPV")-based material and a polyfluorene-based material. The intermediate layer 320 may be formed through screen printing, inkjet printing, laser induced thermal imaging ("LITI"), or the like.

However, the intermediate layer 320 is not necessarily limited thereto, and may have various structures. In addition, the intermediate layer 320 may include a layer that is integrally provided as a single body across the plurality of pixel electrodes 310, or may include a layer patterned to correspond to each of the plurality of pixel electrodes 310.

The opposite electrode 330 may be integrally provided as a single body across a plurality of organic light-emitting diodes to correspond to the plurality of pixel electrodes 310.

Because the organic light-emitting diode OLED may easily be damaged due to external moisture or oxygen, a thin-film encapsulation layer (not shown) or an encapsulation substrate (not shown) may be disposed thereon, to cover and protect the organic light-emitting diodes. A thin-film encapsulation layer (not shown) may cover the display area DA and extend to the outside of the display area DA. Such a thin-film encapsulation layer may include an inorganic encapsulation layer including at least one inorganic material and an organic encapsulation layer including at least one organic material. In some embodiments, the thin-film encapsulation layer may be provided in a structure in which a first inorganic encapsulation layer, an organic encapsulation layer, and a second inorganic encapsulation layer are stacked. The encapsulation layer (not shown) may face the substrate 100 and bonded to the substrate 100 by a sealing member, such as a sealant or frit, in the peripheral area PA.

In addition, a spacer for preventing a dent in the mask may be further included on the pixel-defining layer 120, and various functional layers, such as a polarization layer for reducing external reflection, a touch screen layer including a black matrix, a color filter, and/or a touch electrode, may be provided on the thin-film encapsulation layer.

In an embodiment configured as described above, a display apparatus on which a high-resolution image may be displayed with a substantially low defect rate even in the case of an external shock may be implemented. However, the scope of the disclosure is not limited by this effect.

It should be understood that embodiments described herein should be considered in a descriptive sense only and not for purposes of limitation. Descriptions of features or advantages within each embodiment should typically be considered as available for other similar features or advantages in other embodiments. While embodiments have been described with reference to the drawing figures, it will be understood by those of ordinary skill in the art that various changes in form and details may be made therein without departing from the spirit and scope as defined by the following claims.

What is claimed is:

1. A display apparatus comprising:
    a substrate comprising a display area on which a display element is disposed;
    an emission control transistor which is disposed in the display area, comprises a first semiconductor layer, and is connected to a pixel electrode of an organic light-emitting diode;
    a switching transistor disposed in the display area and comprising a second semiconductor layer; and
    a first initialization transistor disposed in the display area and comprising a third semiconductor layer,
    wherein the first semiconductor layer and the second semiconductor layer each comprise a silicon semiconductor,
    the third semiconductor layer comprises an oxide semiconductor, and
    each of the emission control transistor, the switching transistor, and the first initialization transistor comprises a dual gate electrode.

2. The display apparatus of claim 1, further comprising a first signal line partially overlapping the second semiconductor layer,
    wherein the second semiconductor layer comprises an opening in a closed shape, and
    the first signal line comprises a first switching gate electrode and a second switching gate electrode respectively overlapping a $2^{nd}$-$1^{st}$ semiconductor layer and a $2^{nd}$-$2^{nd}$ semiconductor layer which are separated by the opening.

3. The display apparatus of claim 1, further comprising a second signal line partially overlapping the third semiconductor layer,
    wherein the second signal line comprises a first initialization gate electrode and a second initialization gate electrode respectively overlapping a $3^{rd}$-$1^{st}$ semiconductor layer and a $3^{rd}$-$2^{nd}$ semiconductor layer.

4. The display apparatus of claim 3, wherein the second signal line comprises a $2^{nd}$-$1^{st}$ signal line disposed under the third semiconductor layer and a $2^{nd}$-$2^{nd}$ signal line disposed over the third semiconductor layer,
    the $2^{nd}$-$1^{st}$ signal line comprises a lower gate electrode in an area overlapping the third semiconductor layer, and
    the $2^{nd}$-$2^{nd}$ signal line comprises an upper gate electrode in an area overlapping the third semiconductor layer.

5. The display apparatus of claim 4, wherein at least one of the lower gate electrode and the upper gate electrode is provided as a dual gate electrode.

6. The display apparatus of claim 1, wherein the first semiconductor layer and the second semiconductor layer are integrally provided as a single body.

7. The display apparatus of claim 1, further comprising a driving transistor which controls a magnitude of a driving current flowing to the display element,
    wherein the switching transistor transfers a data voltage to a source electrode of the driving transistor,
    the emission control transistor generates a path of the driving current between the display element, and
    the first initialization transistor applies an initialization voltage to a gate electrode of the driving transistor.

8. The display apparatus of claim 1, further comprising:
a first power voltage line;
a first planarization layer covering the first power voltage line; and
a second planarization layer on the first planarization layer,
wherein the pixel electrode connected to the emission control transistor is disposed on the second planarization layer.

9. A display apparatus comprising:
a substrate comprising a display area on which a display element is disposed;
an emission control transistor which is disposed in the display area, comprises a first semiconductor layer, and is connected to a pixel electrode of an organic light-emitting diode;
a switching transistor disposed in the display area and comprising a second semiconductor layer;
a first initialization transistor disposed in the display area and comprising a third semiconductor layer; and
an emission control line partially overlapping the first semiconductor layer,
wherein the first semiconductor layer and the second semiconductor layer each comprise a silicon semiconductor,
the third semiconductor layer comprises an oxide semiconductor, and
at least one of the emission control transistor, the switching transistor, and the first initialization transistor comprises a dual gate electrode,
the emission control line comprises an opening, and
the dual gate electrode of the emission control transistor is provided in a first emission control gate electrode and a second emission control gate electrode which are both obtained by branching by the opening.

10. The display apparatus of claim 9, wherein the opening is provided as a through hole in a closed shape.

11. A display apparatus comprising:
a substrate comprising a display area on which a display element is disposed;
a driving transistor which controls a magnitude of a driving current flowing to the display element;
an emission control transistor disposed in the display area and connected to a pixel electrode of an organic light-emitting diode;
a switching transistor which is disposed in the display area, comprises a second semiconductor layer comprising a silicon semiconductor, and transfers a data voltage to a source electrode of the driving transistor;
a first initialization transistor which is disposed in the display area, comprises a third semiconductor layer comprising an oxide semiconductor, and applies an initialization voltage to a gate electrode of the driving transistor;
an emission control line partially overlapping the first semiconductor layer; and
a first signal line partially overlapping the second semiconductor layer,
wherein the emission control transistor and the switching transistor each comprise a dual gate electrode.

12. The display apparatus of claim 11, wherein the emission control line and the second semiconductor layer each comprise an opening.

13. The display apparatus of claim 12, wherein the dual gate electrode of the emission control transistor is provided in a first emission control gate electrode and a second emission control gate electrode which are both obtained by branching by the opening of the emission control line.

14. The display apparatus of claim 13, wherein the first signal line comprises a first switching gate electrode and a second switching gate electrode respectively overlapping a $2^{nd}$-$1^{st}$ semiconductor layer and a $2^{nd}$-$2^{nd}$ semiconductor layer which are separated by the opening of the second semiconductor layer.

15. The display apparatus of claim 11, further comprising a second signal line overlapping the third semiconductor layer in a plurality of areas,
wherein the second signal line comprises a first initialization gate electrode and a second initialization gate electrode respectively overlapping a $3^{rd}$-$1^{st}$ semiconductor layer and a $3^{rd}$-$2^{nd}$ semiconductor layer.

16. The display apparatus of claim 15, further comprising an upper gate electrode and a lower gate electrode respectively disposed over and under the third semiconductor layer,
wherein at least one of the upper gate electrode and the lower gate electrode is provided as a dual gate electrode.

17. The display apparatus of claim 11, wherein the first semiconductor layer and the second semiconductor layer are integrally provided as a single body,
the switching transistor and the emission control transistor are provided in p-channel metal-oxide semiconductor field-effect transistors, and
the first initialization transistor is provided in an n-channel metal-oxide semiconductor field-effect transistor.

18. The display apparatus of claim 11, further comprising:
a first power voltage line;
a first planarization layer covering the first power voltage line; and
a data line disposed on the first planarization layer and at least partially overlapping the first power voltage line.

19. The display apparatus of claim 18, further comprising a second power voltage line disposed on the first planarization layer and electrically connected to the first power voltage line.

20. The display apparatus of claim 19, further comprising a second planarization layer on the first planarization layer,
wherein the pixel electrode connected to the emission control transistor is disposed on the second planarization layer.

* * * * *